(12) United States Patent
Bark et al.

(10) Patent No.: US 12,713,966 B2
(45) Date of Patent: Aug. 18, 2026

(54) ELECTRONIC DEVICES AND METHODS OF MANUFACTURING ELECTRONIC DEVICES

(71) Applicant: Amkor Technology Singapore Holding Pte. Ltd., Valley Point #12-03 (SG)

(72) Inventors: Jong Min Bark, Gwangju (KR); Sang Hyoun Lee, Incheon (KR); Hun Jung Lim, Sejong-si (KR); Hyun Il Moon, Gyeonggi-do (KR)

(73) Assignee: Amkor Technology Singapore Holding Pte. Ltd, Singapore (SG)

( * ) Notice: Subject to any disclaimer, the term of this patent is extended or adjusted under 35 U.S.C. 154(b) by 637 days.

(21) Appl. No.: 18/098,833

(22) Filed: Jan. 19, 2023

(65) Prior Publication Data

US 2024/0249986 A1 Jul. 25, 2024

(51) Int. Cl.

| | |
|---|---|
| ***H10W 74/10*** | (2026.01) |
| ***H10P 72/70*** | (2026.01) |
| ***H10W 70/60*** | (2026.01) |
| ***H10W 74/01*** | (2026.01) |

(52) U.S. Cl.

CPC ........... *H10W 74/117* (2026.01); *H10P 72/74* (2026.01); *H10W 70/614* (2026.01); *H10W 74/016* (2026.01); *H10P 72/7416* (2026.01); *H10P 72/7424* (2026.01)

(58) Field of Classification Search

None

See application file for complete search history.

(56) References Cited

U.S. PATENT DOCUMENTS

| | | | | |
|---|---|---|---|---|
| 2020/0075488 | A1* | 3/2020 | Wu | H10W 20/435 |
| 2021/0035961 | A1* | 2/2021 | Lim | H01L 24/16 |
| 2024/0047322 | A1* | 2/2024 | Chen | H01L 23/49838 |

* cited by examiner

*Primary Examiner* — Jay C Chang

(74) *Attorney, Agent, or Firm* — Kevin B. Jackson

(57) ABSTRACT

In one example, an electronic device includes a substrate including a substrate upper side and a conductive structure comprising substrate upper terminals adjacent to the substrate upper side. Vertical interconnects are coupled to the substrate upper terminals. An encapsulant covers portions of the substrate and the vertical interconnects. The vertical interconnects are exposed from an upper side of the encapsulant. A redistribution structure is over the encapsulant and includes a redistribution structure upper side, a redistribution structure lower side, a redistribution dielectric structure, and a redistribution conductive structure. The redistribution structure includes redistribution upper terminals adjacent to the redistribution structure upper side and redistribution bottom terminals adjacent to the redistribution lower side. The redistribution bottom terminals are coupled to the vertical interconnects and the redistribution upper terminals. An electronic component is coupled to the redistribution upper terminals. Other examples and related methods are also disclosed herein.

19 Claims, 23 Drawing Sheets

112
122
1245
1224
1245
1224
1245
1224
1244
1245
1224
1245
1224
1245
1224
124
124
124
1243
122
1222
122
1222
1243
1242
1243
1222
1243
1222
1243
12
12

112
3C
122
146
3B
14
144
14
14
3A
142
1244
146
14
144
1245
14
142
1224
124
124
124
1243
122
1222
122
1242
1222
12
12

13
124
124
124
1224
1222
14
1242
1244
122
1222
122
122
1243
14
12
13

151
15

1462
146
1462
1245
1244
1224
D4
H3

144
1245
1244
1224
D3
H2

142
1424
1422
1245
1244
1224
D2
D1
H1

112
313
124
1224
142
14
1245
144
146
16
1244
122
1222
12
1242
1243

313
124
151
1224
1222
14
16
1242
15
1244
122
1243
12
146
38
142

ELECTRONIC DEVICES AND METHODS OF MANUFACTURING ELECTRONIC DEVICES

CROSS-REFERENCE TO RELATED APPLICATIONS

Not applicable.

TECHNICAL FIELD

The present disclosure relates, in general, to electronic devices, and more particularly, to semiconductor devices and methods for manufacturing semiconductor devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, 2F-1, 2G, 2H, 2I, 2J, 2K, and 2L show cross-sectional views of an example method for manufacturing an example electronic device.

Figure 1:
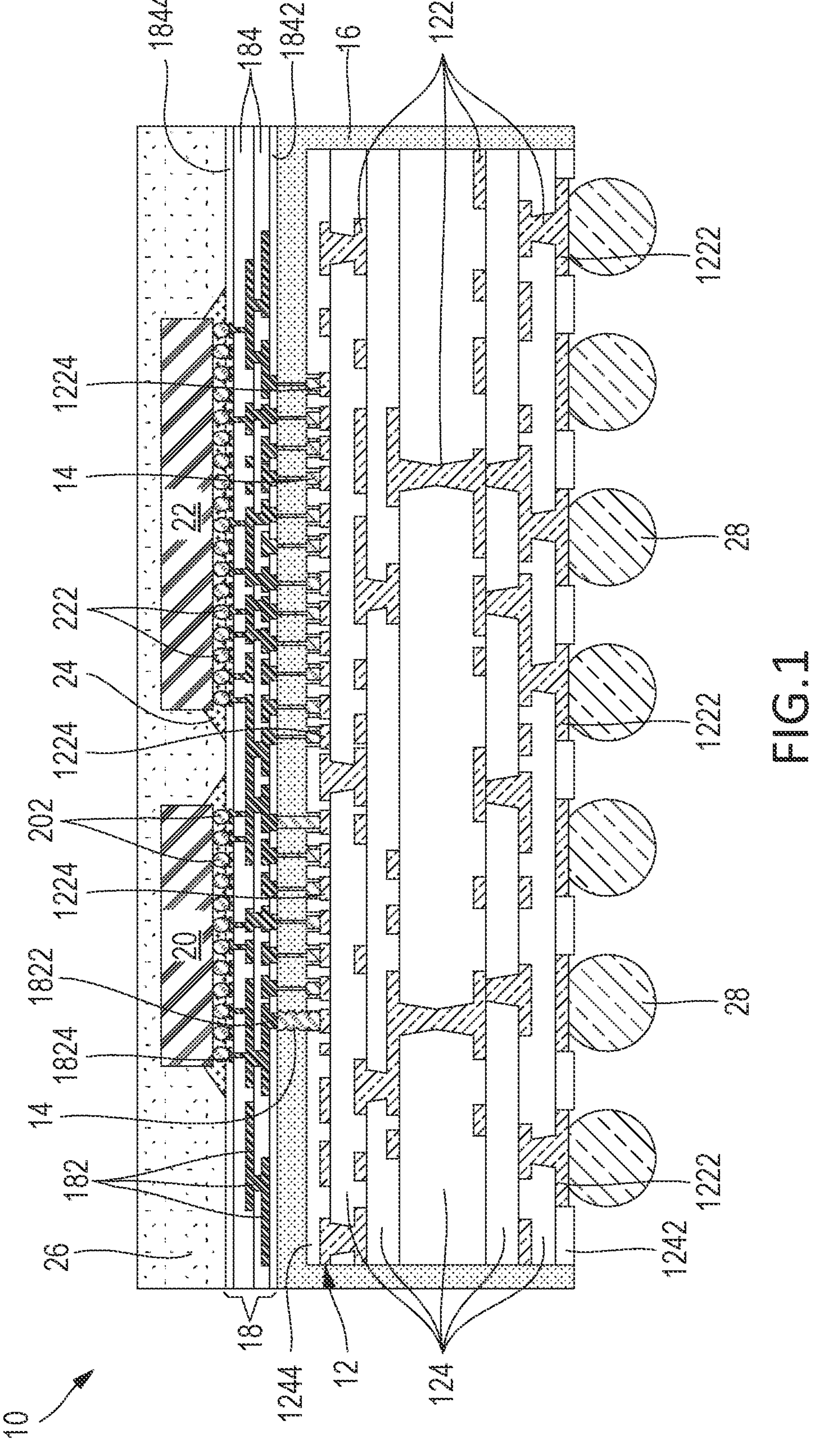
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises." "comprising," "includes," and "including" are "open ended" terms and specify the presence of stated features, but do not preclude the presence or addition of one or more other features.

The terms "first," "second." etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. As used herein, the term "coupled" can refer to an electrically coupling or a mechanical coupling. Similarly, the terms "over" or "on" may be used to describe two elements directly contacting each other or describe two elements indirectly coupled by one or more other elements.

DESCRIPTION

In an example, an electronic device includes a base substrate including a base substrate top side, a base substrate bottom side opposite to the base substrate top side, base substrate sidewalls, a base dielectric structure, and a base conductive structure. The base conductive structure includes substrate top terminals adjacent to the base substrate top side. The electronic device includes vertical interconnects with proximate ends coupled to the substrate top terminals and distal ends opposite to the proximate ends. A substrate encapsulant covers portions of the base substrate top side and the vertical interconnects and includes a substrate encapsulant top side. The distal ends of the vertical interconnects are exposed from the substrate encapsulant top side. A redistribution structure is over the substrate encapsulant and includes a redistribution structure top side, a redistribution structure bottom side opposite to the redistribution structure top side, a redistribution dielectric structure including a first dielectric over the top side of the substrate encapsulant and including first openings exposing the distal ends of the vertical interconnects, and a redistribution conductive structure positioned within the redistribution dielectric structure. The redistribution conductive structure includes redistribution bottom terminals adjacent to the redistribution bottom side and coupled to the vertical interconnects through the first openings, and redistribution top terminals adjacent to the redistribution structure top side. A first electronic component coupled to the redistribution top terminals at the redistribution structure top side.

In an example, an electronic device includes a base substrate including a base substrate upper side and a base conductive structure comprising substrate upper terminals adjacent to the base substrate upper side. Vertical interconnects are coupled to the substrate upper terminals. A substrate encapsulant covers portions of the base substrate upper side and the vertical interconnects. The substrate encapsulant comprises a substrate encapsulant upper side and the vertical interconnects are exposed from the substrate encapsulant upper side. A redistribution structure is over the substrate encapsulant and includes a redistribution structure upper side, a redistribution structure lower side opposite to the redistribution structure upper side, a redistribution dielectric structure, and a redistribution conductive structure. The redistribution structure includes redistribution upper terminals adjacent to the redistribution structure upper side and redistribution bottom terminals adjacent to the redistribution lower side. The redistribution bottom terminals are coupled to the vertical interconnects and the redistribution upper terminals. A first electronic component is coupled to the redistribution upper terminals adjacent to redistribution structure upper side.

In an example, a method of manufacturing an electronic device includes providing a substrate assembly that includes a base substrate including a base substrate top side and a base conductive structure comprising substrate top terminals adjacent to the base substrate top side. The substrate assembly includes vertical interconnects coupled to the substrate top terminals and a substrate encapsulant covering portions of the base substrate top side and the vertical interconnects. The substrate encapsulant includes a substrate encapsulant top side and the vertical interconnects are exposed from the encapsulant top side. The substrate assembly includes a redistribution structure over the substrate encapsulant. The redistribution structure includes a redistribution structure top side, a redistribution structure bottom side opposite to the redistribution structure top side, a redistribution dielectric structure, and a redistribution conductive structure positioned within the redistribution dielectric structure. The redistribution conductive structure includes redistribution top terminals adjacent to the redistribution structure top side and redistribution bottom terminals adjacent to the redistribution bottom side. The redistribution bottom terminals are coupled to the vertical interconnects and the redistribution top terminals. The method includes coupling a first electronic component to the redistribution top terminals.

Other examples are included in the present disclosure. Such examples may be found in the figures, in the claims, or in the description of the present disclosure.

FIG. 1 shows a cross-sectional view of example electronic device 10. In the example shown in FIG. 1, electronic device 10 can comprise base substrate 12, vertical interconnects 14, substrate encapsulant 16, redistribution structure 18, electronic components 20 and 22, encapsulant 26, and external interconnects 28. In some examples, electronic device 10 can comprise underfill 24.

Base substrate 12 can comprise base conductive structure 122 and base dielectric structure 124. Base conductive structure 122 can comprise substrate bottom terminals 1222 and substrate top terminals 1224. Base dielectric structure 124 can comprise bottom base dielectric layer 1242 and top base dielectric layer 1244.

Redistribution structure 18 can comprise conductive structure 182 and dielectric structure 184. Conductive structure 182 can comprise bottom terminals 1822 and top terminals 1824. Dielectric structure 184 can comprise bottom dielectric 1842 and top dielectric 1844. In some examples, electronic component 20 can comprise component terminals 202, and electronic component 22 can comprise component terminals 222.

FIGS. 2A to 2L show cross-sectional views of an example method for manufacturing an example electronic device.

Figures 2A, 2B:
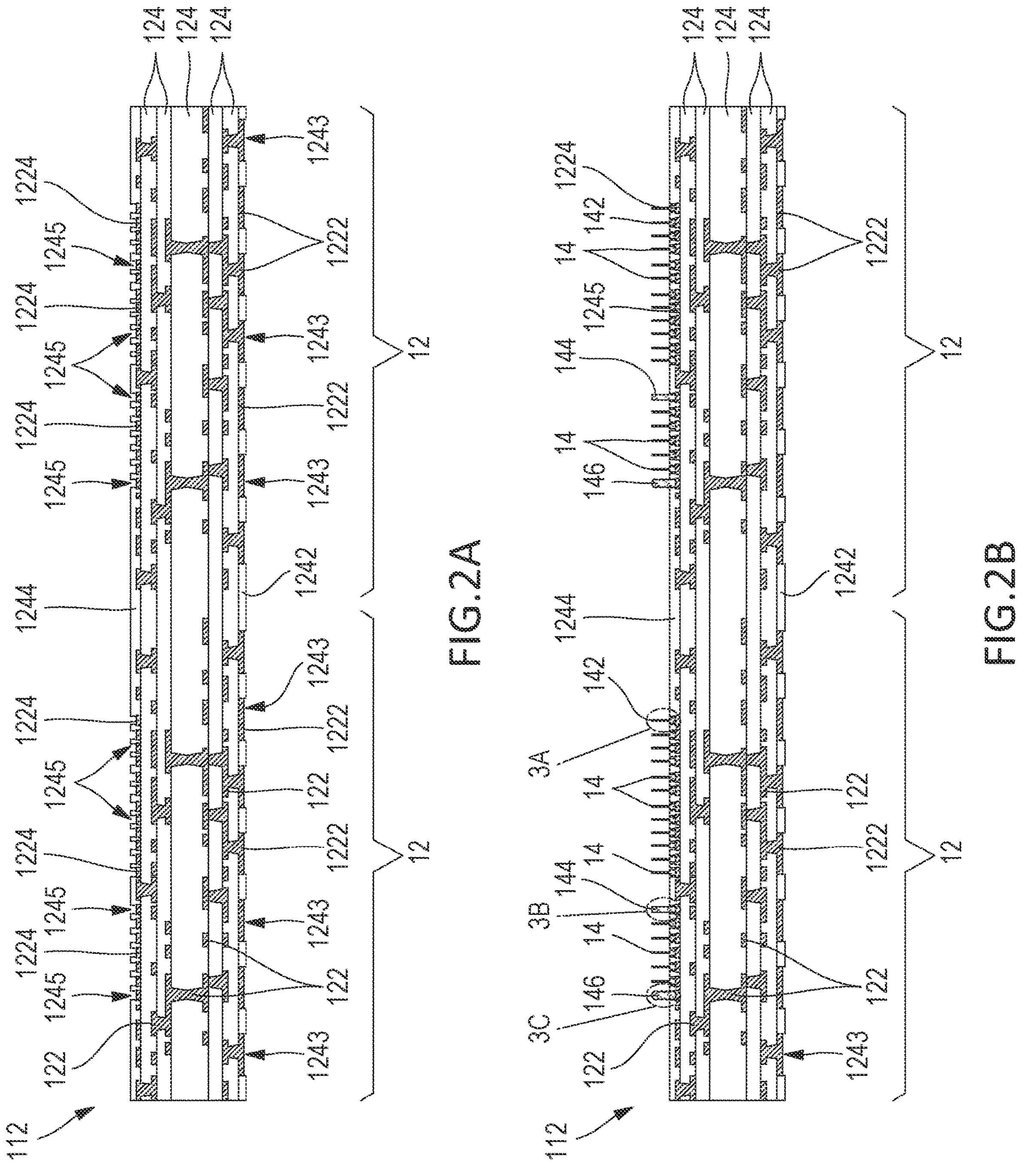

FIG. 2A is a cross-sectional view of electronic device 10 at an early stage of manufacture. In the example shown in FIG. 2A, base substrate 12 is provided and can comprise base conductive structure 122 and base dielectric structure 124. In some examples, a plurality of base substrates 12 can be connected in the form of one substrate strip 112. Substrate strip 112 can comprise base substrates 12. In some examples, substrate strip 112 can comprise or be referred to as a strip, an array, a matrix, or a panel. In some examples, base substrate 12 can be a unit.

Base conductive structure 122 can be one or more conductive layers and define conductive paths with elements, such as traces, pads, vias and wiring patterns. Base conductive structure 122 can comprise substrate bottom terminals 1222 provided on a lower side of base substrate 12 and substrate top terminals 1224 provided on an upper side of base substrate 12. Substrate bottom terminals 1222 and substrate top terminals 1224 can be provided on the lower and upper sides of base substrate 12 to be spaced apart from each other in the row or column direction, respectively. In some examples, substrate bottom terminals 1222 or substrate top terminals 1224 can comprise or be referred to as conductors, conductive materials, substrate lands, conductive lands, substrate pads, wiring pads, connection pads, micro pads, traces, or under-bump-metallurgies (UBMs). In some examples, base conductive structure 122 can comprise copper, iron, nickel, gold, silver, palladium, or tin. In some examples, the thicknesses of substrate bottom terminals 1222 or substrate top terminals 1224 can range from approximately 40 μm (micrometers) to approximately 100 μm.

In some examples, base dielectric structure 124 can comprise or be referred to as one or more stacked dielectric layers. For instance, the one or more dielectric layers can comprise, one or more core layers, polymer layers, pre-preg layers, or solder mask layers stacked on each other. One or more layers or elements of base conductive structure 122 can be interleaved with base dielectric structure 124. In some examples, base dielectric structure 124 can comprise an epoxy resin, a phenolic resin, a glass epoxy, a polyimide, a polyester, an epoxy molding compound, or a ceramic. Base dielectric structure 124 can comprise bottom base dielectric layer 1242 positioned below base substrate 12, and top base dielectric layer 1244, positioned above base substrate 12.

Bottom base dielectric layer 1242 can comprise base bottom openings 1243 exposing substrate bottom terminals 1222 from a lower portion of base substrate 12. Top base dielectric layer 1244 can comprise base top openings 1245 exposing substrate top terminals 1224 from an upper portion of base substrate 12. In some examples, after bottom base dielectric layer 1242 is provided to cover the lower side of base substrate 12 and substrate bottom terminals 1222, base bottom openings 1243 exposing portions of substrate bottom terminals 1222 can be provided. In some examples, after top base dielectric layer 1244 is provided to cover the upper side of base substrate 12 and the substrate top terminals 1224, base top openings 1245 exposing portions of substrate top terminals 1224 can be provided. In some examples, the area of substrate bottom terminals 1222 and substrate top terminals 1224 respectively exposed through base bottom openings 1243 and base top openings 1245 can range from approximately 40 μm×40 μm to approximately 100 μm×100 μm.

In some examples, bottom base dielectric layer 1242 or top base dielectric layer 1244 can comprise or be referred to as a passivation layer, a solder mask, or a solder resist. For example, the bottom base dielectric layer 1242 or the top base dielectric layer 1244 can comprise an epoxy resin or a phenolic resin. In some examples, the thickness of base dielectric structure 124 can range from approximately 15 μm to approximately 100 μm.

In some examples, base substrate 12 can comprise or be referred to as a laminate substrate, a ceramic substrate, a rigid substrate, a glass substrate, a silicon substrate, a printed circuit board, a multilayer substrate, or a molded lead frame. In some examples, base substrate 12 can have a thickness of approximately 0.2 millimeters (mm) to approximately 2.5 mm.

In some examples, base substrate 12 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process. Substrates, as described herein, can also comprise a pre-formed substrate.

In some examples, base substrate 12 can be a redistribution layer (RDL) substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, PI, BCB, or PBO. Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates, as disclosed herein, can comprise RDL substrates.

FIG. 2B shows a cross-sectional view of electronic device 10 at a later stage of manufacture. In the example shown in FIG. 2B, vertical interconnects 14 can be provided on the base substrate 12. Vertical interconnects 14 can be coupled to substrate top terminals 1224 exposed through base top openings 1245 in base substrate 12. Vertical interconnects 14 can be in contact with and electrically connected to substrate top terminals 1224, respectively. Vertical interconnects 14 can be provided to each of base substrates 12 included in substrate strip 112. In some examples, vertical interconnects 14 can comprise or be referred to as vertical wires, pillars, studs, solder balls, or solder-coated conductive core balls (CCBs). In some examples, vertical interconnects 14 can comprise vertical interconnects 142, vertical interconnects 144, or vertical interconnects 146. In some examples, a pitch (i.e., distance) between adjacent vertical interconnects 14 can range from approximately 35 μm to 150 μm, 35 μm to 90 μm, 35 μm to 70 μm, 35 μm to 50 μm, 50 μm to 150 μm. 50 μm to 90, 50 μm to 70 μm, or 70 μm to 150 μm. In some examples, the pitch of vertical interconnects 14 is less than or equal to 90 μm. In some examples, the pitch of vertical interconnects 14 is less than or equal to 70 μm. In some examples, the pitch of vertical interconnects 14 is less than or equal to 50 μm.

Figures 3A, 3B, 3C:
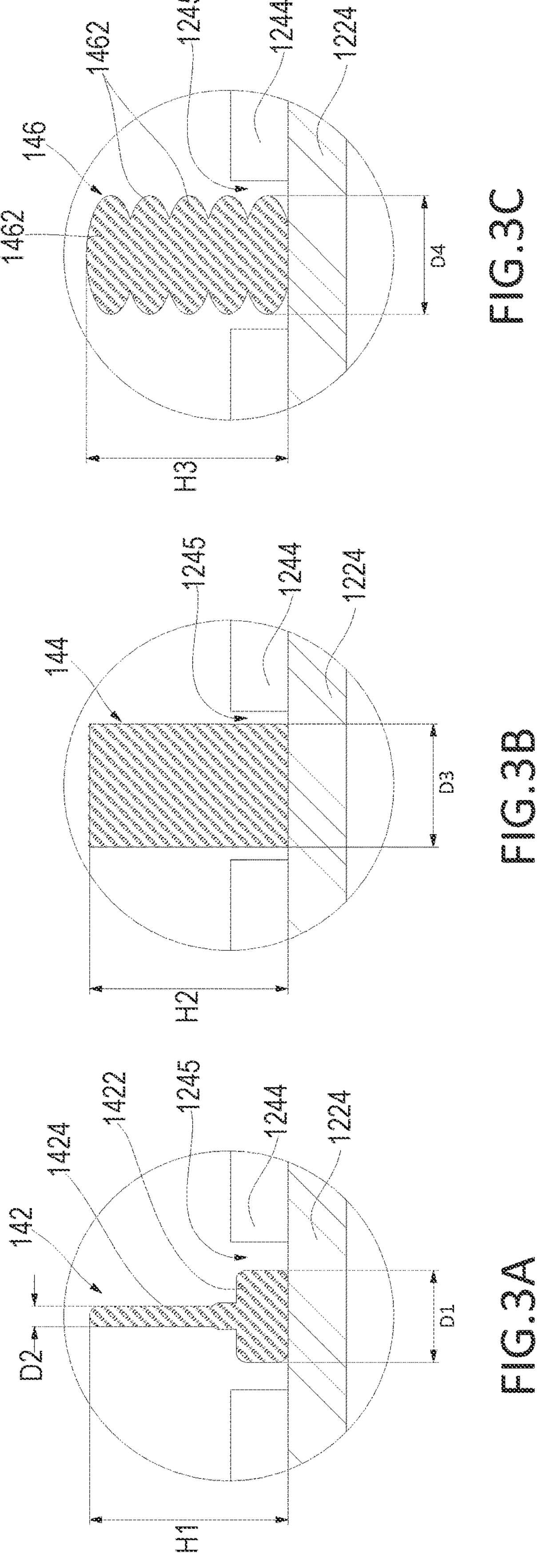
FIGS. 3A, 3B, and 3C show cross-sectional views of example vertical interconnects of an example electronic device.

FIGS. 3A, 3B, and 3C show enlarged cross-sectional views of portions 3A, 3B, and 3C of example electronic device 10 of FIG. 2B.

In the example shown in FIG. 3A, vertical interconnects 142 can be provided by wire bonds. Vertical interconnects 142 can comprise an interconnect head 1422 and an interconnect tail 1424 extending upwardly from the center of the interconnect head 1422. Vertical interconnects 142 can bond conductive wires to substrate top terminals 1224 through wire bonding equipment. In some examples, interconnect tail 1424 is a conductive wire and can be made of gold, copper or aluminum. In some examples, vertical interconnects 142 can include ball-shaped interconnect head 1422 and interconnect tail 1424 being a conductive wire. Interconnect head 1422 can be melted by a thermocompression bonding, ultrasonic or thermosonic process to contact and electrically connect to substrate top terminals 1224. Vertical interconnects 142 can be made of conductive wires, and thus can be provided to have a narrow pattern and pitch.

The diameter D1 of interconnect head 1422 can be greater than the diameter D2 of interconnect tail 1424. In some examples, the diameter D1 of interconnect head 1422 can range from approximately 20 μm to approximately 40 μm, the diameter D2 of interconnect tail 1424 can range from approximately 13 μm to approximately 30 μm. In some examples, vertical interconnects 142 can have an overall height H1 in a range from approximately 200 μm to approximately 500 μm. In some examples, the overall height H1 to diameter D2 ratio of vertical interconnects 142 can be a range from about 6 to 1 and about 33 to 1.

In the example shown in FIG. 3B, vertical interconnects 144 can be conductive posts or conductive pillars. Vertical interconnects 144 can be provided by electrolytic plating, electroless plating, sputtering, physical vapor deposition (PVD), chemical vapor deposition (CVD), metal-organic CVD (MOCVD), atomic layer deposition (ALD), low-pressure CVD (LPCVD), or plasma-enhanced CVD (PECVD). In some examples, vertical interconnects 144 can be made of copper, gold, silver, palladium, or nickel. Vertical interconnects 144 can be in contact with and electrically connected to substrate top terminals 1224. In some examples, the overall height H2 of vertical interconnects 144 can be similar to overall height H1 of vertical interconnects 142, and the diameter D3 can range from approximately 20 μm to approximately 40 μm. In some examples, the overall height H2 to diameter D3 of vertical interconnects 144 can be in a range from about 5 to 1 and about 25 to 1.

In the example shown in FIG. 3C, vertical interconnects 146 can be stacked bumps. Vertical interconnects 146 can be provided by aligning bumps 1462 on top of bumps 1462 and then stacking and melting the same. Vertical interconnects 146 can be provided by stacking two or more bumps 146. Vertical interconnects 146 can be made of gold, copper, aluminum, or solder. Vertical interconnects 146 can be in contact with and electrically connected to substrate top terminals 1224. In some examples, the overall height H3 of vertical interconnects 146 can be similar to overall height H1 of vertical interconnects 142, and the diameter D4 can range from approximately 20 μm to approximately 40 μm. In some examples, the overall height H3 to diameter D4 of vertical interconnects 146 can be in a range from about 5 to 1 and about 25 to 1. As illustrated in FIGS. 3A, 3B, and 3C, each of vertical interconnects 142, 144, and 146 have a proximate end coupled to substrate top terminals 1224 and a distal end opposite to the proximate end. In some examples, the distal ends are spaced apart from substrate top terminals 1224.

Figures 2C, 2D:
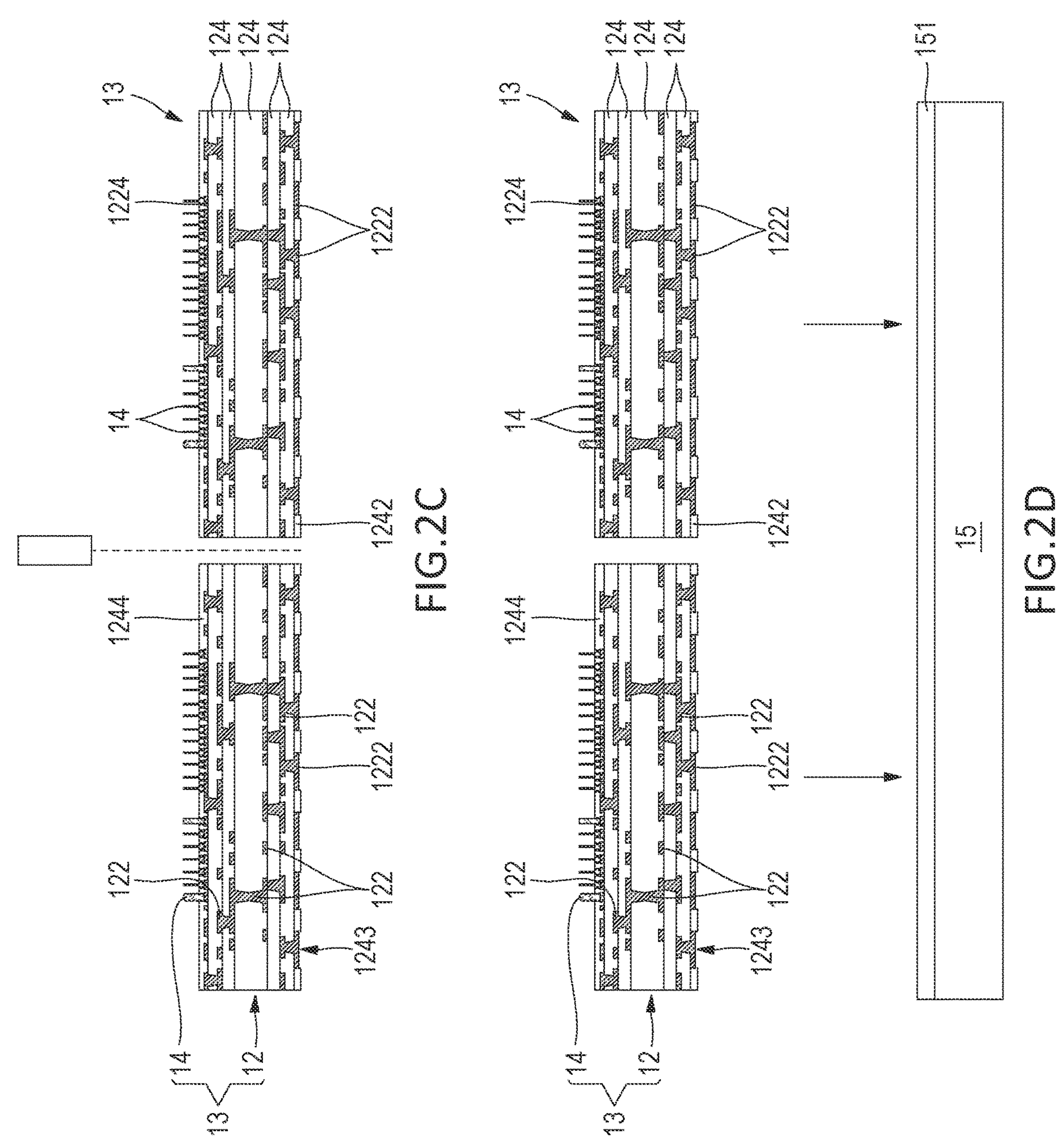

FIG. 2C shows a cross-sectional view of electronic device 10 at a later stage of manufacture. In the example shown in FIG. 2C, vertical interconnects 14 and base substrates 12 can be separated into substrate assemblies 13 through a singulation process of sawing substrate strip 112. Substrate assembly 13 can comprise base substrate 12 and vertical interconnects 14. In some examples, substrate strip 112 can be separated into substrate assemblies 13 using a blade, laser, or plasma separation process. In some examples, the overall area of each substrate assembly 13 can range from approximately 8 mm×8 mm to approximately 150 mm×150 mm.

FIG. 2D shows a cross-sectional view of electronic device 10 at a later stage of manufacture. In the example shown in FIG. 2D, substrate assemblies 13 can be seated on and coupled to the upper side of carrier 15. Substrate assemblies 13 can be spaced apart from each other over carrier 15.

Carrier 15 can be a substantially planar plate or wafer. In some examples, carrier 15 can comprise or be referred to as a plate, a board, a wafer, a panel, or a strip. For example, carrier 15 can be made of steel, stainless steel, aluminum, copper, ceramic, glass, or a wafer. In some examples, the thickness of carrier 15 can range from approximately 150 μm to approximately 2000 μm, and the width of carrier 15 can range from approximately 100 mm to approximately 300 mm. Carrier 15 can serve to provide integrated handling of multiple components in the process of providing substrate encapsulant 16, redistribution structure 18, electronic components 20 and 22, and encapsulant 26 on two or more substrate assemblies 13, as described in further detail below.

Carrier 15 can comprise carrier release layer 151 provided on the upper surface of carrier 15. Substrate assemblies 13 can be provided on the surface of carrier release layer 151 of carrier 15. Substrate assemblies 13 can have bottom base dielectric layer 1242 in contact with and adhered to the surface of carrier release layer 151. Carrier release layer 151 can be applied to the surface of carrier 15 by: a coating method, such as spin coating, doctor blade, casting, painting, spray coating, slot die coating, curtain coating, slide coating, or knife over edge coating; a printing method, such as screen printing, pad printing, gravure printing, flexographic printing, or offset printing; an inkjet printing method, a technology between coating and printing; or direct attachment of an adhesive film or adhesive tape. In some examples, carrier release layer 151 can be referred to as a temporary adhesive layer, a temporary adhesive film, a temporary adhesive tape, or a temporary adhesive coating. For example, carrier release layer 151 can be a heat release tape (or film) or a light release tape (or film), where the adhesive strength is weakened or removed by heat or light, respectively. In some examples, the adhesive force of carrier release layer 151 can be weakened or removed using chemicals or physical force.

Figures 2E, 2F:
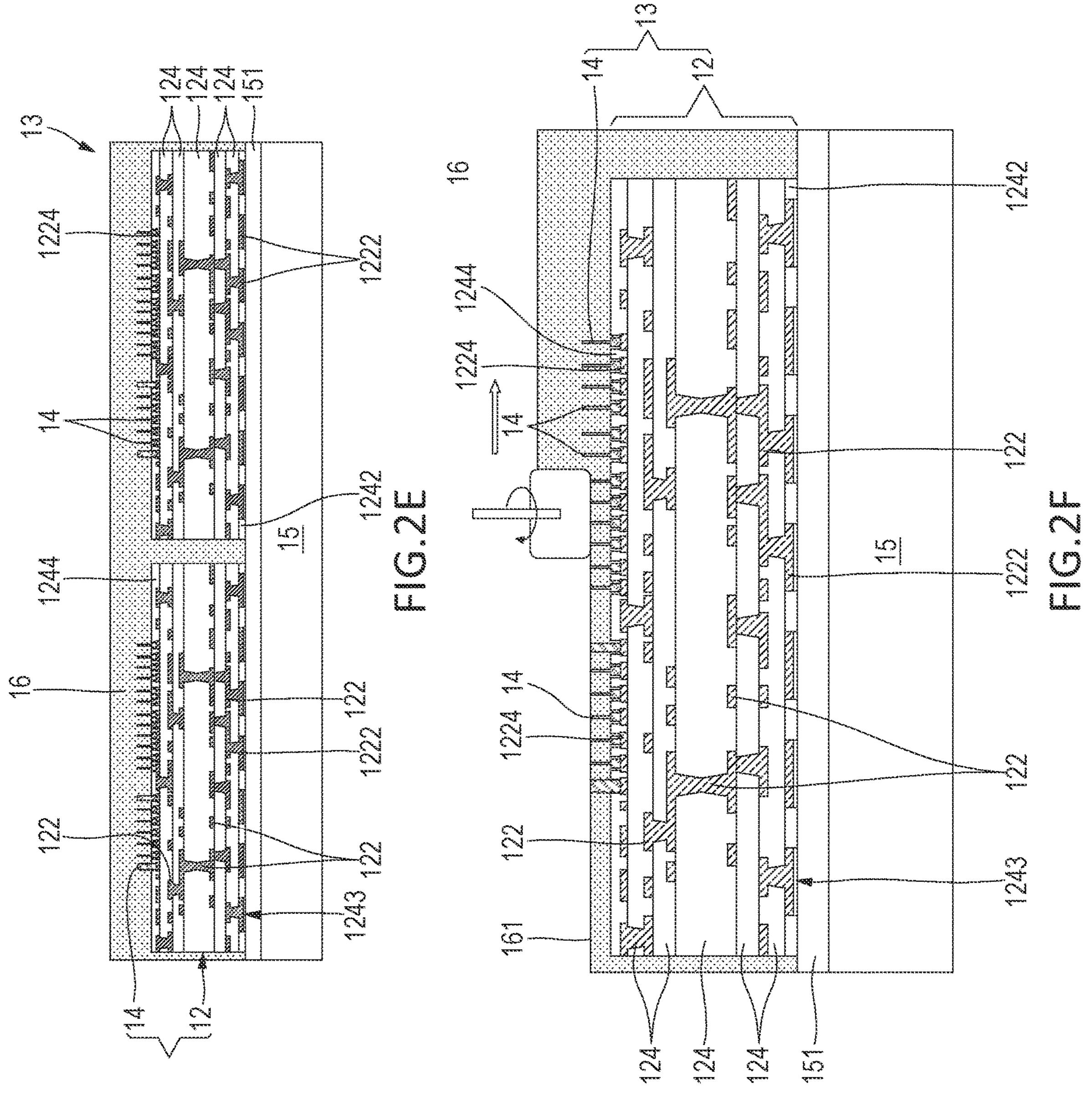
Figures 1, 2F:
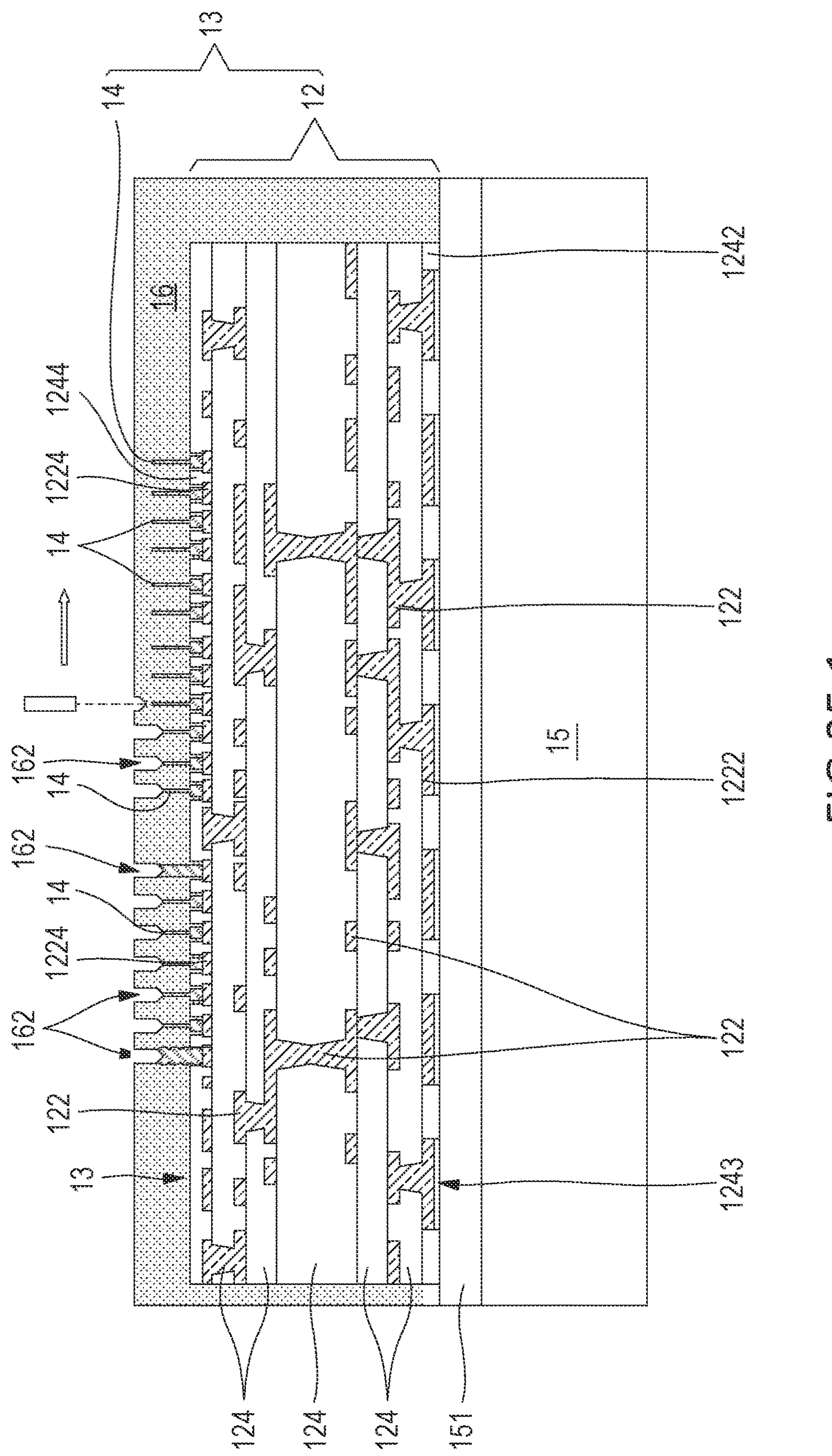

FIG. 2E shows a cross-sectional view of electronic device 10 at a later stage of manufacture. In the example shown in FIG. 2E, substrate encapsulant 16 can be provided over substrate assemblies 13. Substrate encapsulant 16 can cover substrate assemblies 13. For example, substrate encapsulant 16 can contact the top and sidewalls of substrate assemblies 13 and can contact the top side of carrier release layer 151 of carrier 15. Substrate encapsulant 16 can be interposed between sidewalls of adjacent substrate assemblies 13. Substrate encapsulant 16 can contact the top and sidewalls of base substrate 12 and the top and sidewalls of vertical interconnects 14.

In some examples, substrate encapsulant 16 can comprise or be referred to as a body or a molding. For example, substrate encapsulant 16 can comprise an epoxy mold compound, a resin, an organic polymer with organic filler, a curing agent, a catalyst, a coupling agent, a colorant, or a flame retardant, and can be formed by compression molding, transfer molding, liquid body molding, vacuum lamination, paste printing or film assisted molding. Substrate encapsulant 16 can protect base substrate 12 and vertical interconnects 14 from external elements. Substrate encapsulant 16 can allow the upper sides of two or more substrate assemblies 13 to be coplanar, thereby facilitating the process of providing redistribution layer 18 (FIG. 2H) over substrate assemblies 13. In some examples, the thickness of substrate encapsulant 16 can range from approximately 150 μm to approximately 1600 μm.

FIG. 2F shows a cross-sectional view of electronic device 10 at a later stage of manufacture. Although one substrate assembly 13 is shown to allow for enlargement of the structures in FIGS. 2F to 2J, it is contemplated and understood that a plurality of substrate assemblies 13 can be located on carrier 15.

In the example shown in FIG. 2F, an upper portion of substrate encapsulant 16 can be removed to expose vertical interconnects 14. By removing the upper portion of substrate encapsulant 16, vertical interconnects 14 can be exposed from top side 161 of substrate encapsulant 16. In some examples, the upper side of vertical interconnect 14 can be coplanar with upper side 161 of substrate encapsulant 16. In some examples, the upper portion of substrate encapsulant 16 can be removed by grinding. In some examples, the thickness of substrate encapsulant 16 can range from approximately 100 μm to approximately 1500 μm.

With reference to FIG. 2F-1, in some examples, grinding of substrate encapsulant 16 can be stopped before vertical interconnects 14 are exposed. For example, after grinding the upper side of substrate encapsulant 16, portions of substrate encapsulant 16 located over vertical interconnects 14 can be selectively removed, thereby exposing vertical interconnects 14 to the upper side of substrate encapsulant 16. Vertical interconnects 14 can be upwardly exposed through openings 162 in substrate encapsulant 16. In some examples, the portions of substrate encapsulant 16 located over vertical interconnects 14 can been removed (e.g., by laser) from the upper side of substrate encapsulant 16 to a depth that exposes vertical interconnects 14. In the present example, the distal ends of vertical interconnects 14 are recessed with respect to upper side 161 of encapsulant 16. A thicker substrate encapsulant 16 (e.g., a substrate encapsulant 16 that extends above vertical interconnects 14) can reduce manufacturing issues, such as warpage, particularly, when base substrate 12 is thin (e.g., when base substrate 12 has a thickness of 100 μm or less).

Figure 2G:
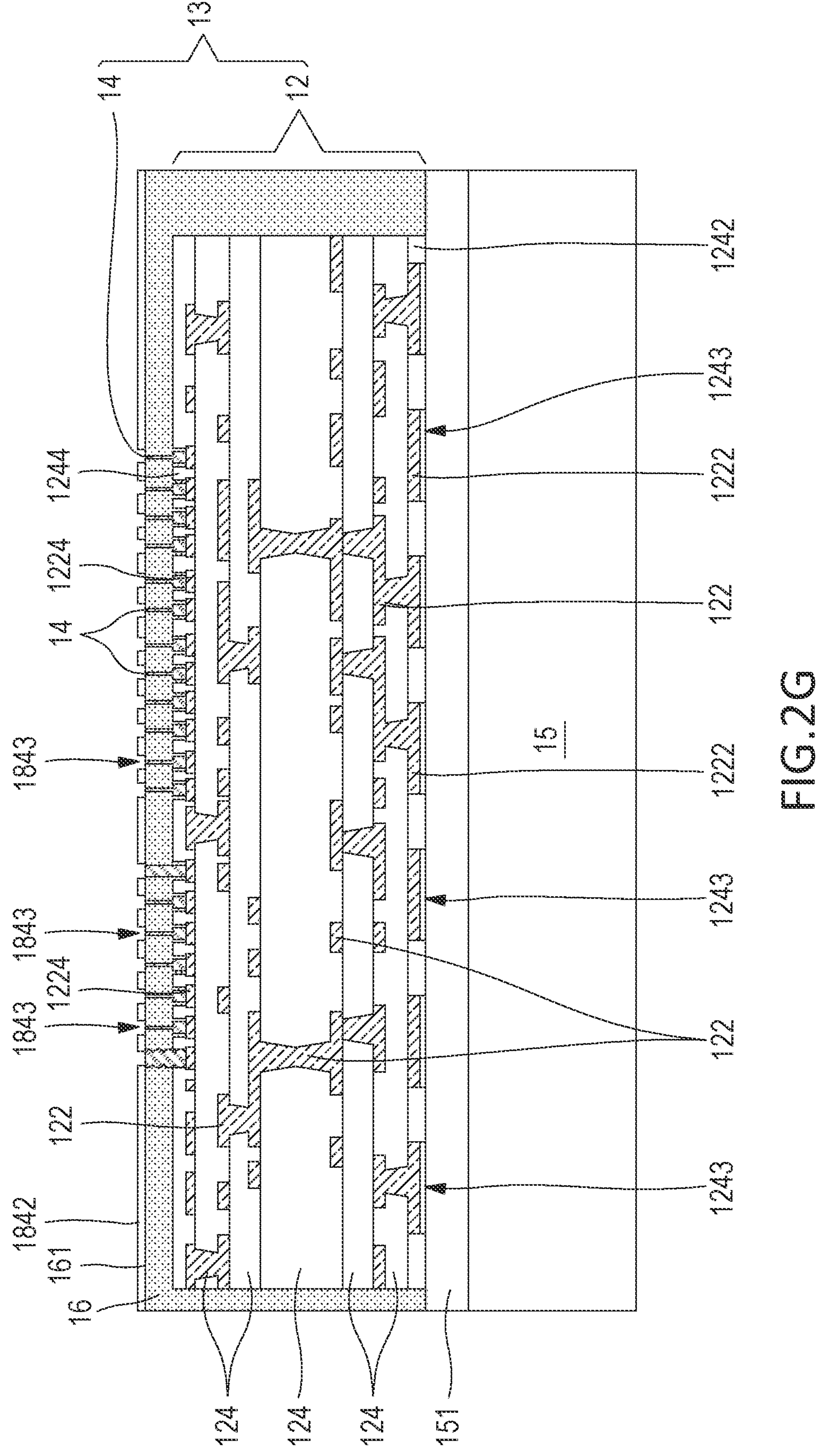

FIG. 2G shows a cross-sectional view of electronic device 10 at a later stage of manufacture. In the example shown in FIG. 2G, bottom dielectric 1842 can be provided to over upper side 161 of substrate encapsulant 16. Bottom dielectric 1842 can contact the upper side of substrate encapsulant 16. Bottom dielectric 1842 can be provided to a uniform thickness to cover the upper side of substrate encapsulant 16 and the upper side of vertical interconnects 14, and then bottom dielectric openings 1843 exposing vertical interconnects 14 can be provided. For example, bottom dielectric openings 1843 can be provided by forming a mask pattern on the upper side of bottom dielectric 1842 and then removing (e.g., etching) portions of bottom dielectric 1842 exposed from the mask pattern. In some examples, bottom dielectric openings 1843 can be referred to as or comprise apertures or holes. In accordance with various examples, bottom dielectric 1842 can comprise an electrically insulating material, such as polymer, polyimide (PI), benzocyclobutene (BCB), polybenzoxazole (PBO), bismaleimide triazine (BT), a molding material, a phenolic resin, an epoxy, silicone, or an acrylate polymer. In some examples, bottom dielectric 1842 can be provided by spin coating, spray coating, dip coating, or rod coating. In some examples, the thickness of bottom dielectric 1842 can range from approximately 5 μm to approximately 50 μm.

Figure 2H:
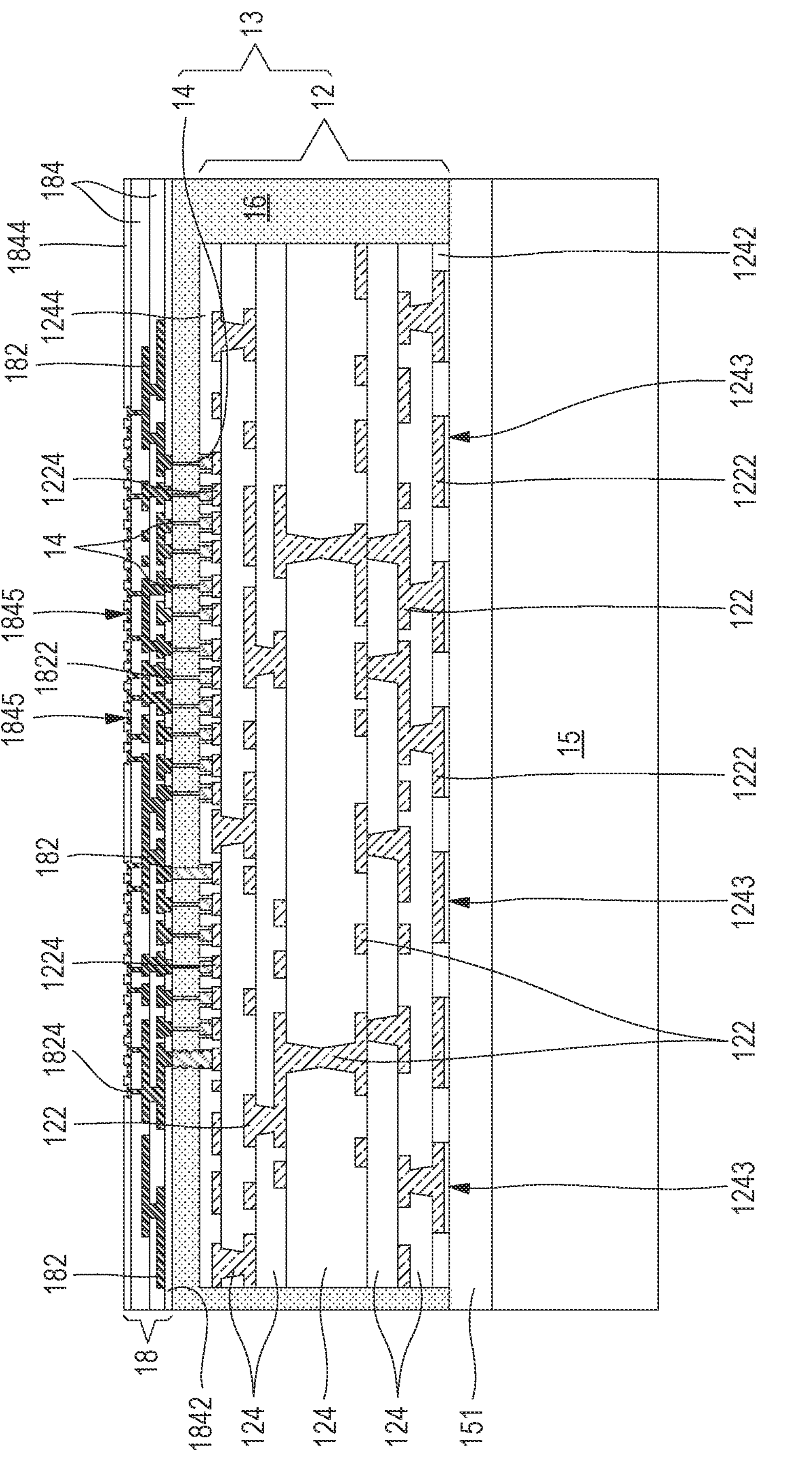

FIG. 2H shows a cross-sectional view of electronic device 10 at a later stage of manufacture. In the example shown in FIG. 2H, redistribution structure 18 can be provided on the upper side of bottom dielectric 1842. Redistribution structure 18 can comprise dielectric structure 184 and conductive structure 182. Dielectric structure 184 can comprise bottom dielectric 1842 positioned on the bottom or lower side of redistribution structure 18 and top dielectric 1844 positioned on the top side or upper side of redistribution structure 18. Conductive structure 182 can be positioned within dielectric structure 184 and can comprise bottom terminals 1822 coupled to vertical interconnects 14 through bottom dielectric openings 1843 of bottom dielectric 1842. Portions of conductive structure 182 can be positioned on the upper side of redistribution structure 18 and can comprise top terminals 1824 exposed through top dielectric openings 1845 of top dielectric 1844.

In redistribution structure 18, one or more layers or elements of conductive structure 182 can be interleaved with dielectric structure 184. Conductive structure 182 includes bottom terminals 1822, which can be provided in bottom dielectric openings 1843 (FIG. 2G) and coupled to vertical interconnects 14. In some examples, bottom terminals 1822 can comprise or be referred to as pads or under-bump-metallurgies (UBMs). In some examples, the thickness of bottom terminals 1822 can range from approximately 5 μm to approximately 50 μm, and the pitch of bottom terminals 1822 can range from approximately 35 μm to 150 μm, 35 μm to 90 μm, 35 μm to 70 μm, 35 μm to 50 μm, 50 μm to 150 μm, 50 μm to 90, 50 μm to 70 μm.

Dielectric structure 184 can comprise one or more dielectric layers. When dielectric structure 184 comprises two or more dielectric layers, the upper dielectric layer can upwardly expose conductive structure 182 electrically connected to bottom terminals 1822. In some examples, dielectric structure 184 can comprise or be referred to as one or more dielectric layer(s), coreless layer(s), solder mask layer (s), insulating layer(s), or filler-free layer(s). Dielectric structure 184 can have similar elements, features, materials, or manufacturing methods to those of bottom dielectric 1842.

Conductive structure 182 can be provided on the upper side of dielectric structure 184 so as to be coupled to bottom terminals 1822. In some examples, conductive structure 184 can comprise or be referred to as one or more conductive layer(s), trace(s), pad(s), conductive via(s), redistribution layer(s) (RDLs), wiring pattern(s), or circuit pattern(s). Conductive structure 184 can be provided by electrolytic plating, electroless plating, sputtering, PVD, CVD, MOCVD, ALD, LPCVD, or PECVD. Conductive structure 184 can be made of, for example, copper, gold, silver, palladium, or nickel.

Top terminals 1824 of conductive structure 182 and top dielectric 1844 of dielectric structure 184 are located on the uppermost side or top side of redistribution structure 18. Top dielectric 1844 can upwardly expose top terminals 1824 through or from top dielectric openings 1845.

Redistribution structure 18 can comprise or be referred to as a RDL substrate, a buildup substrate, a coreless substrate, or a fine-pitch substrate. In some examples, the pitch of bottom terminal 1822 can be greater than the pitch of top terminals 1824. In some examples, a pitch of top terminals 1824 can be between 2 μm and 70 μm, between 2 μm and 50 μm, between 2 μm and 25 μm, between 2 μm and 10 μm, between 2 μm and 5 μm, between 5 μm and 50 μm, between 5 μm and 25 μm, between 5 μm and 10 μm, between 15 μm and 50 μm, or between 15 μm and 25 μm. For example, top terminals 1824 can have a fine or narrow pitch (e.g., a pitch less than 50 μm, less than 35 μm, less than 25 μm, less than 15 μm, less than 10 μm, or less than 5 μm) and bottom terminals 1822 can have a relatively wide or coarse pitch (e.g., a pitch of 35 μm to 150 μm, a pitch of 35 μm to 90 μm, a pitch of 35 μm to 50 μm, a pitch of 35 μm or greater, or a pitch of 50 μm or greater), as compared to the pitch of top terminals 1824. In some examples, a ratio of the pitch of bottom terminals 1822 to the pitch of top terminals 1824 may be between 30:1 and 1.5:1, between 15:1 and 3:1, between 10:1 and 2:1, or between 15:1 and 7:1, or between 10:1 and 7:1.

Conductive structure 182 can also be referred to as a redistribution conductive structure and dielectric structure 184 can also be referred to as a redistribution dielectric structure. Bottom dielectric 1842 is an example of a first dielectric and bottom dielectric openings 1843 are an example of first openings. The pitch between substrate top terminals 1224, between vertical interconnect 14, or bottom terminals 1822 is an example of a first pitch. The pitch between top terminals 1824 of conductive structure 182 is an example of a second pitch.

Figure 2I:
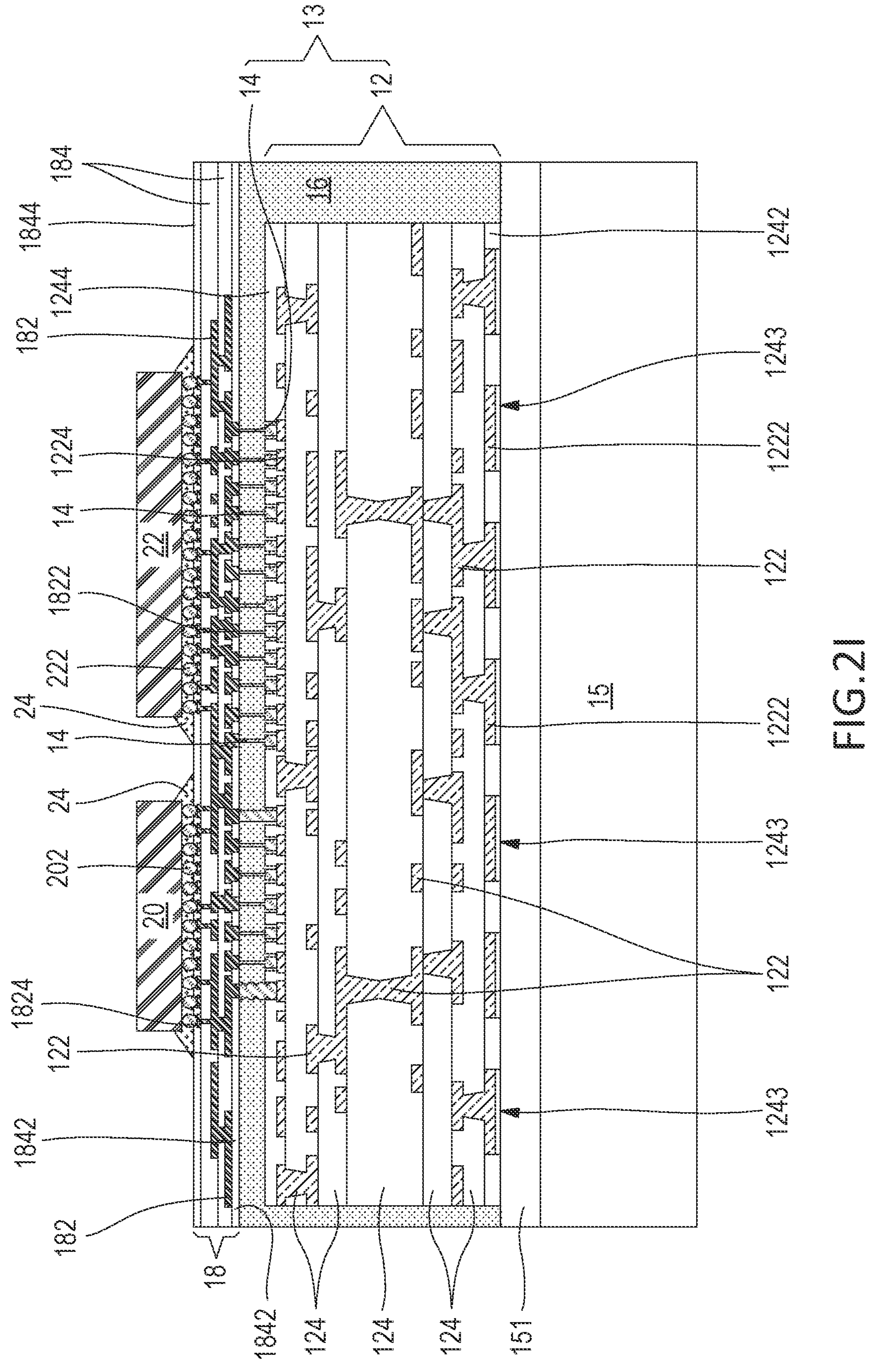

FIG. 2I shows a cross-sectional view of electronic device 10 at a later stage of manufacture. In the example shown in FIG. 2I, electronic components 20 and 22 can be provided on redistribution structure 18. In some examples, pick-and-place equipment can pick up the electronic components 20 and 22, respectively, and place electronic components 20 and 22 on the upper side of redistribution structure 18. In some examples, electronic components 20 and 22 can be coupled to top terminals 1824 of redistribution structure 18 through a mass reflow, thermal compression, or laser assisted bonding process. In some examples, electronic components 20 and 22 can comprise or be referred to as one or more semiconductor dies, semiconductor chips, or semiconductor packages. In some examples, electronic components 20 and 22 can comprise or be referred to as active or passive devices.

Electronic components 20 and 22 can comprise component terminals 202, 222, respectively. Component terminals 202, 222 can be spaced apart from each other in a row or column direction over electronic components 20 and 22. In some examples, component terminals 202, 222 can comprise or be referred to as pads, bumps, pillars, conductive posts, solder balls, or metal (e.g., copper) posts with solder caps. Component terminals 202, 222 can comprise a conductive material, such as aluminum, copper, an aluminum alloy, or a copper alloy. In some examples, component terminals 202, 222 can be input/output terminals or ground terminals of electronic components 20 and 22. In some examples, direct copper-copper bonding can be employed between top terminals 1824 of redistribution structure 18 and component terminals 202. 222 of electronic components 20 and 22. For examples, hybrid bonding techniques may be employed to couple component terminals 202, 222 of electronic components 20 and 22 to top terminals 1824 of redistribution structure 18. Hybrid bonding tends to allow for narrower pitch component terminals 202, 222 as compared to, for example, bonding component terminals 202, 222 comprising solder bumps or conductive pillars.

In some examples, component terminals 202, 222 can comprise a low-melting material, such as solder, and can be coupled to top terminals 1824 of redistribution structure 18 through the low-melting material. For example, the low-melting material can comprise one or more of Sn—Pb, Sn37-Pb, Sn95-Pb, Sn—Pb—Ag, Sn—Cu. Sn—Ag. Sn—Au, Sn—Bi, and Sn—Ag—Cu. In some examples, component terminals 202, 222 can be coupled, without solder, to top terminals 1824 of redistribution structure 18. The overall thicknesses of electronic components 20 and 22 can range from approximately 50 μm to approximately 800 μm, and the area (or footprint) of each of electronic component 20 and electronic component 22 can range from approximately 0.5 mm×0.5 mm to approximately 100 mm×100 mm.

In some examples, underfill 24 can be disposed between electronic component 20 and redistribution structure 18, and between electronic component 22 and redistribution structure 18. Underfill 24 can comprise or be referred to as a dielectric layer or a non-conductive paste and can be free of inorganic fillers. In some examples, underfill 24 can comprise or be referred to as a capillary (CUF), a non-conductive paste (NCP), a non-conductive film (NCF), an anisotropic conductive film (ACF), or an anisotropic conductive paste (ACP). In some examples, underfill 24 can be a molded underfill (MUF) and can be considered a part of encapsulant 26 (FIG. 2J) (i.e., encapsulant 26 can be disposed between electronic component 20 and redistribution structure 18, and between electronic component 22 and redistribution structure 18).

In some examples, after electronic components 20 and 22 are coupled to redistribution structure 18, underfill 24 can be positioned between electronic component 20 and redistribution structure 18 and between electronic component 22 and redistribution structure 18, and then cured. In some examples, after underfill 24 is provided to cover top dielectric 1844 and top terminals 1824 of redistribution structure 18, component terminals 202 and 222 of electronic components 20 and 22 can pass through underfill 24 to be coupled to top terminals 1824. Underfill 24 can prevent, or reduce occurrences of, electronic components 20 and 22 from being separated from redistribution structure 18 by physical and chemical impact.

Although electronic components 20 and 22 are shown coupled to top terminals 1824 in a face-down or "flip-chip" configuration, there can be examples where electronic components 20 and 22 can be coupled to top terminals 1824 face-up or in a wire-bond configuration.

Figure 2J:
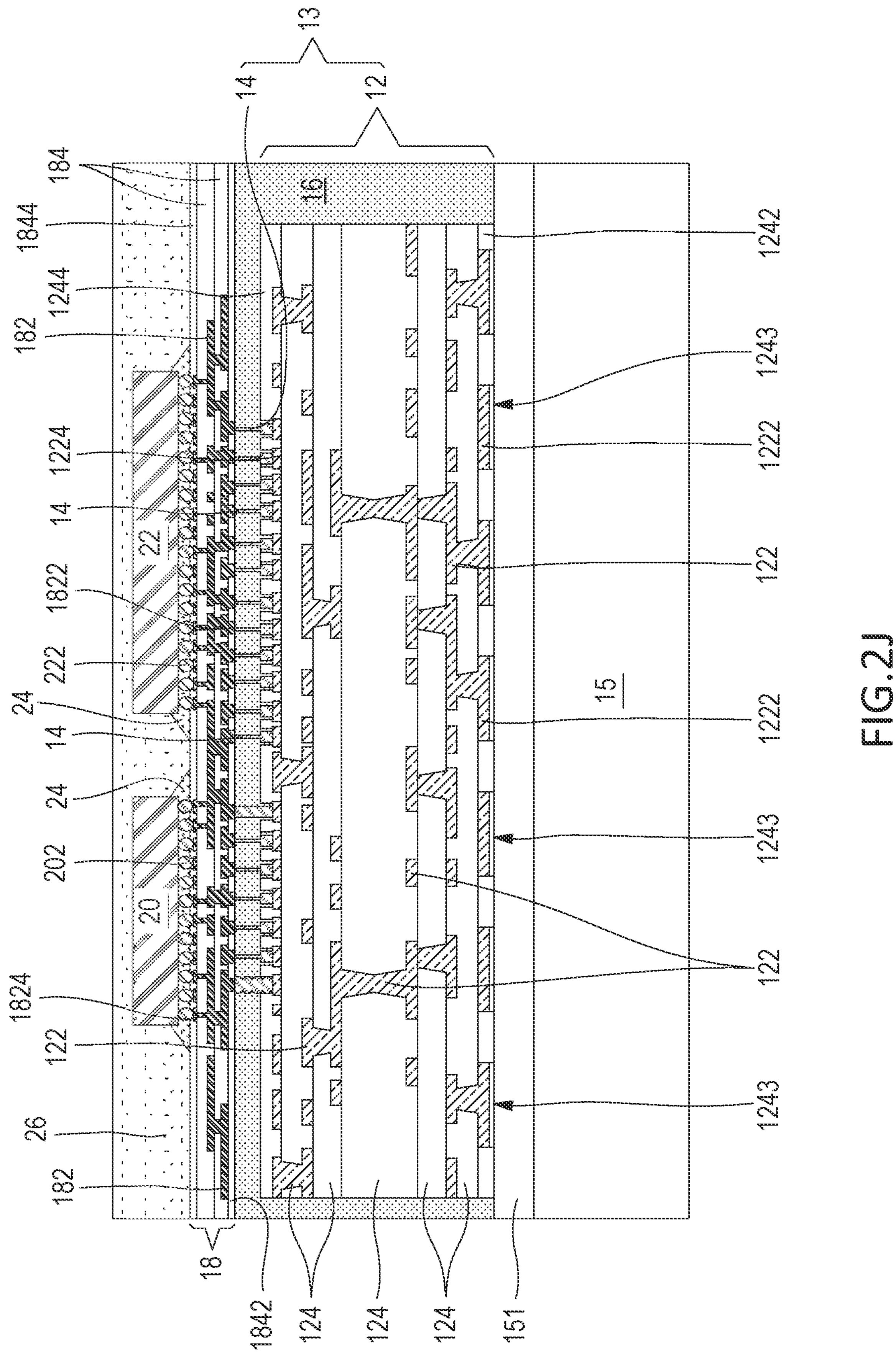

FIG. 2J shows a cross-sectional view of electronic device 10 at a later stage of manufacture. In the example shown in FIG. 2J, encapsulant 26 can be provided to over electronic components 20 and 22 and redistribution structure 18. Encapsulant 26 can contact the upper side and sidewalls of electronic components 20 and 22 and can contact top dielectric 1844 of redistribution structure 18. In some examples, encapsulant 26 can be in contact with the sidewalls of underfill 24. In some examples, encapsulant 26 can comprise or be referred to as a body, a molding, or a lid. In some examples, encapsulant 26 can comprise an organic resin, an inorganic filler, a curing agent, a catalyst, a coupling agent, a colorant, or a flame retardant, and can be formed by compression molding, transfer molding, liquid body molding, vacuum lamination, paste printing, or film assist molding. In some examples, the thickness of encapsulant 26 can range from approximately 150 μm to approximately 1600 μm. Encapsulant 26 can protect electronic components 20 and 22 from external elements and can provide structural integrity in electronic device 10.

Figure 2K:
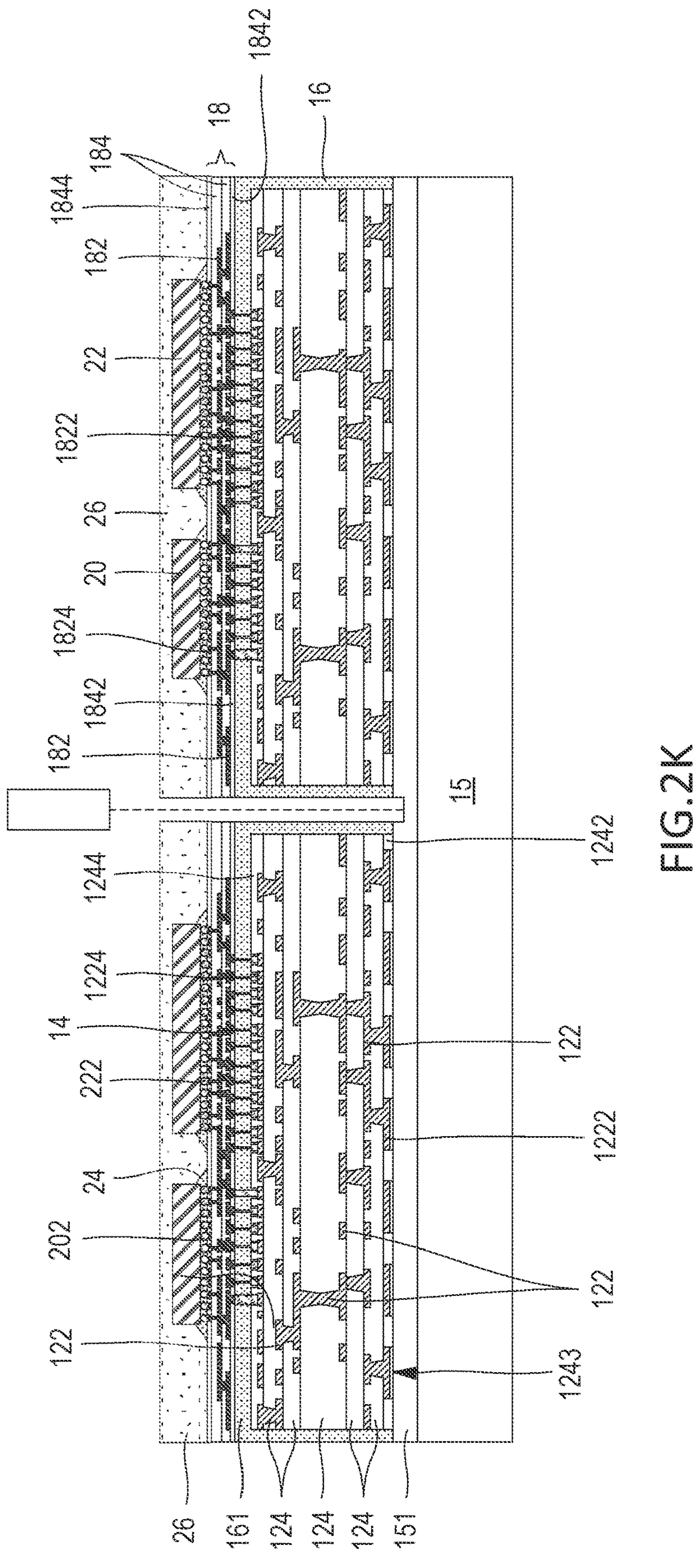

FIG. 2K shows a cross-sectional view of electronic device 10 at a later stage of manufacture. In the example shown in FIG. 2K, encapsulant 26, redistribution structure 18, and substrate encapsulant 16 can be separated into individual electronic devices 10 through a singulation process. Substrate encapsulant 16 can be singulated while leaving intervening portions between substrate assemblies 13. Separated individual electronic devices 10 can comprise base substrate 12, vertical interconnects 14, substrate encapsulant 16, redistribution structure 18, electronic components 20 and 22, and encapsulant 26. In some examples, electronic device 10 can comprise underfill 24. In some examples, electronic device 10 can be singulated using a blade, a laser, or plasma as a singulation tool. Substrate encapsulant 16, redistribution structure 18, and encapsulant 26 can be exposed to, or can define, the sidewalls of electronic device 10.

Figure 2L:
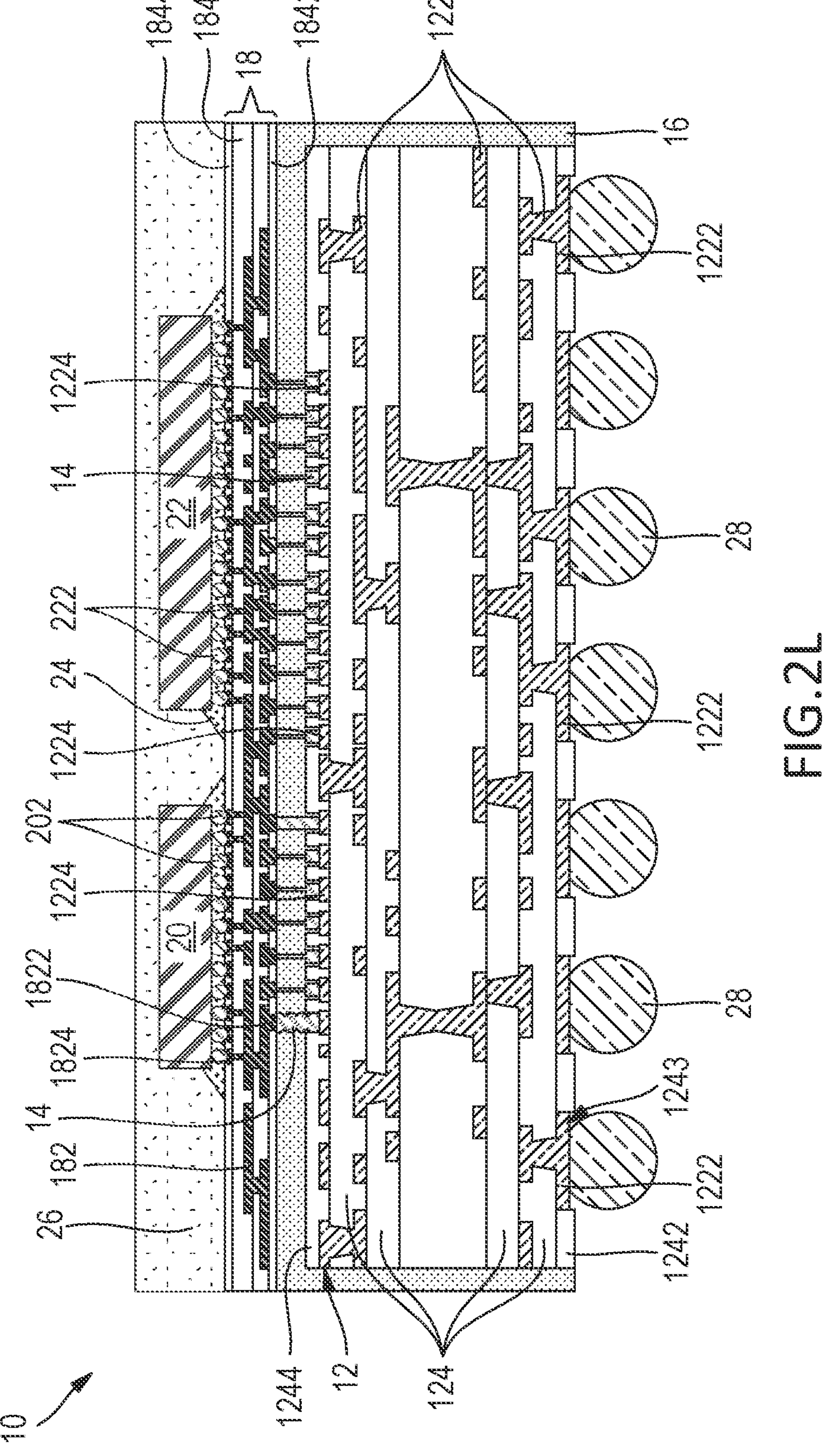

FIG. 2L shows a cross-sectional view of electronic device 10 at a later stage of manufacture. In the example shown in FIG. 2L, carrier 15 can be separated from the lower sides of electronic devices 10. In some examples, after the adhesive strength of carrier release layer 151 is removed or reduced by providing heat, light, a chemical solution, or physical external force, carrier 15 can be separated from the lower side of electronic device 10. Carrier release layer 151 of carrier 15 can be separated from electronic device 10 while being attached to carrier 15. Carrier 15 can be removed, so substrate bottom terminals 1222 and bottom base dielectric layer 1242 of base substrate 12 of electronic device 10 are exposed.

In accordance with various examples, external interconnects 28 can be provided on substrate bottom terminals 1222. External interconnects 28 can be coupled to substrate bottom terminals 1222 of base substrate 12. External interconnects 28 can be coupled to electronic components 20 and 22 through conductive structure 182 of redistribution structure 18, vertical interconnects 14, and base conductive structure 122 of base substrate 12. Electronic components 20 and 22 can be coupled to each other, for example, through redistribution structure 18, and can be electrically connected to external interconnects 28.

In some examples, external interconnects 28 can comprise or be referred to as conductive balls or bumps (e.g., solder balls or solder bumps), conductive pillars or posts (e.g., copper pillars or copper posts), or conductive posts with solder caps. In some examples, external interconnects 28 can comprise tin (NS), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 28 can be formed through a reflow process after forming a conductive material including solder on the substrate bottom terminals 1222 of the base substrate 12 through a ball drop method. In some examples, the height of external interconnects 28 can range from approximately 0.25 mm to approximately 1.5 mm. In some examples, external interconnects 28 can be referred to as external input/output terminals of electronic device 10.

In accordance with various examples, electronic device 10 can comprise base substrate 12, vertical interconnects 14, substrate encapsulant 16, redistribution structure 18, electronic components 20 and 22, encapsulant 26, and external interconnects 28.

Figure 4:
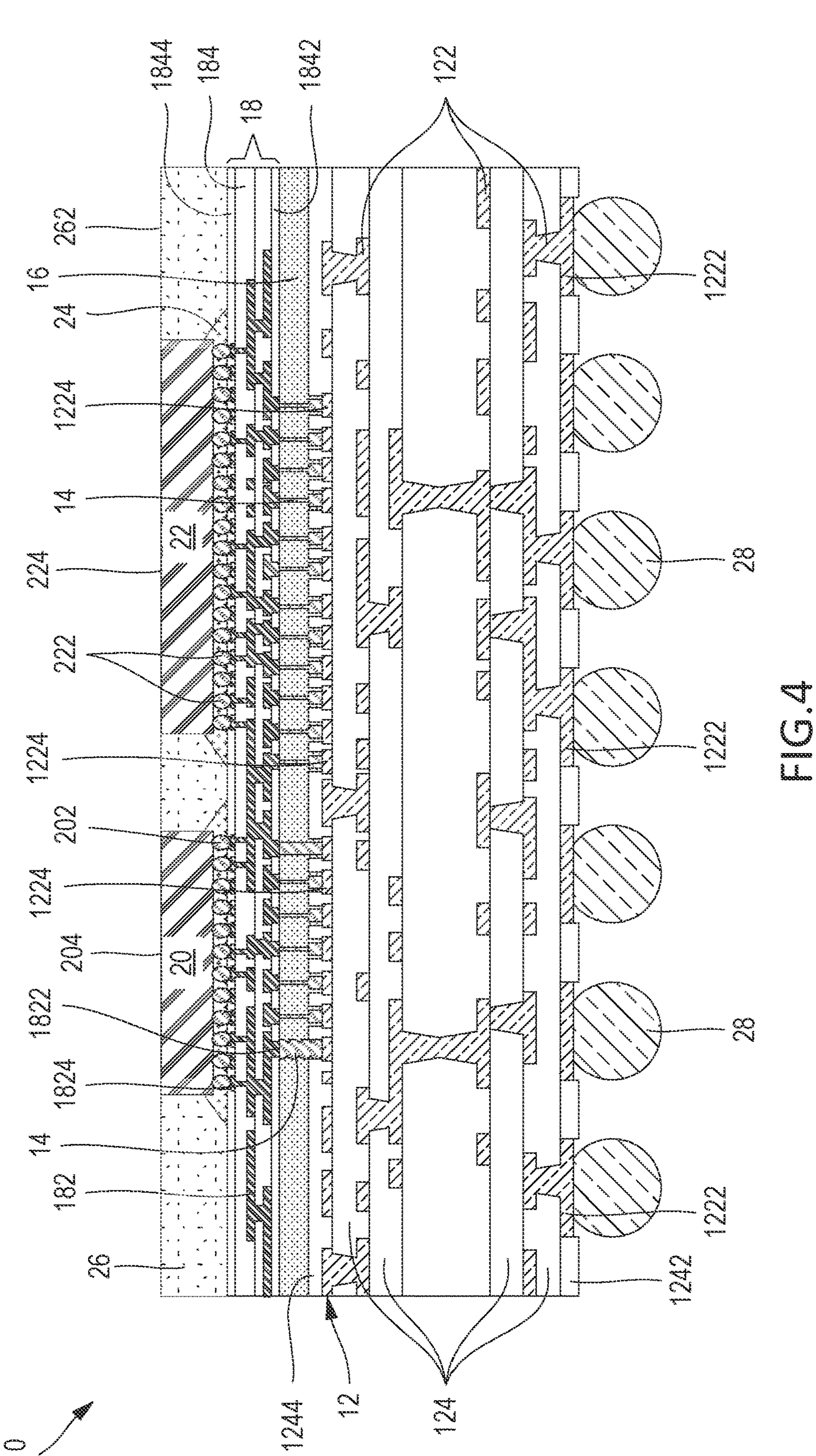
FIG. 4 shows a cross-sectional view of an example electronic device.

FIG. 4 shows a cross-sectional view of an example electronic device 210. In the example shown in FIG. 4, electronic device 210 can comprise base substrate 12, vertical interconnects 14, substrate encapsulant 16, redistribution structure 18, electronic components 20 and 22, encapsulant 26, and external interconnects 28.

In this example, electronic device 210 can have a manufacturing method and structure similar to the electronic device 10, as described above. For example, electronic device 210 can be similar to electronic device 10 in terms of base substrate 12, vertical interconnects 14, redistribution structure 18, electronic components 20 and 22, and external interconnects 28. In this example, in electronic device 210, the sidewalls of substrate encapsulant 16 can be coplanar with those of base substrate 12. In this example, upper side 262 of encapsulant 26 can be coplanar with upper side 204 electronic component 20 and upper side 224 of electronic component 22.

In some examples, after encapsulant 26 is provided, as shown in FIG. 2J, the upper portion of encapsulant 26 can be removed by, for example, grinding, to expose the upper sides 204, 224 of electronic components 20 and 22. By exposing upper sides 204 and 224 of electronic components 20 and 22 to the upper portions of encapsulant 26, heat dissipation of the electronic components 20 and 22 can be facilitated and the height of electronic device 210 can be reduced. In some examples, encapsulant 26 can be thinned by general grinding or chemical etching.

In some examples, in the singulation process shown in FIG. 2K, substrate encapsulant 16 covering the sidewalls of base substrate 12 can be removed. The sidewalls of substrate encapsulant 16 can be coplanar with the sidewalls of base substrate 12. The sidewalls of substrate encapsulant 16 can be coplanar with the sidewalls of redistribution structure 18 and the sidewalls of encapsulant 26. Substrate encapsulant 16 can be interposed between base substrate 12 and redistribution structure 18.

Figure 5:
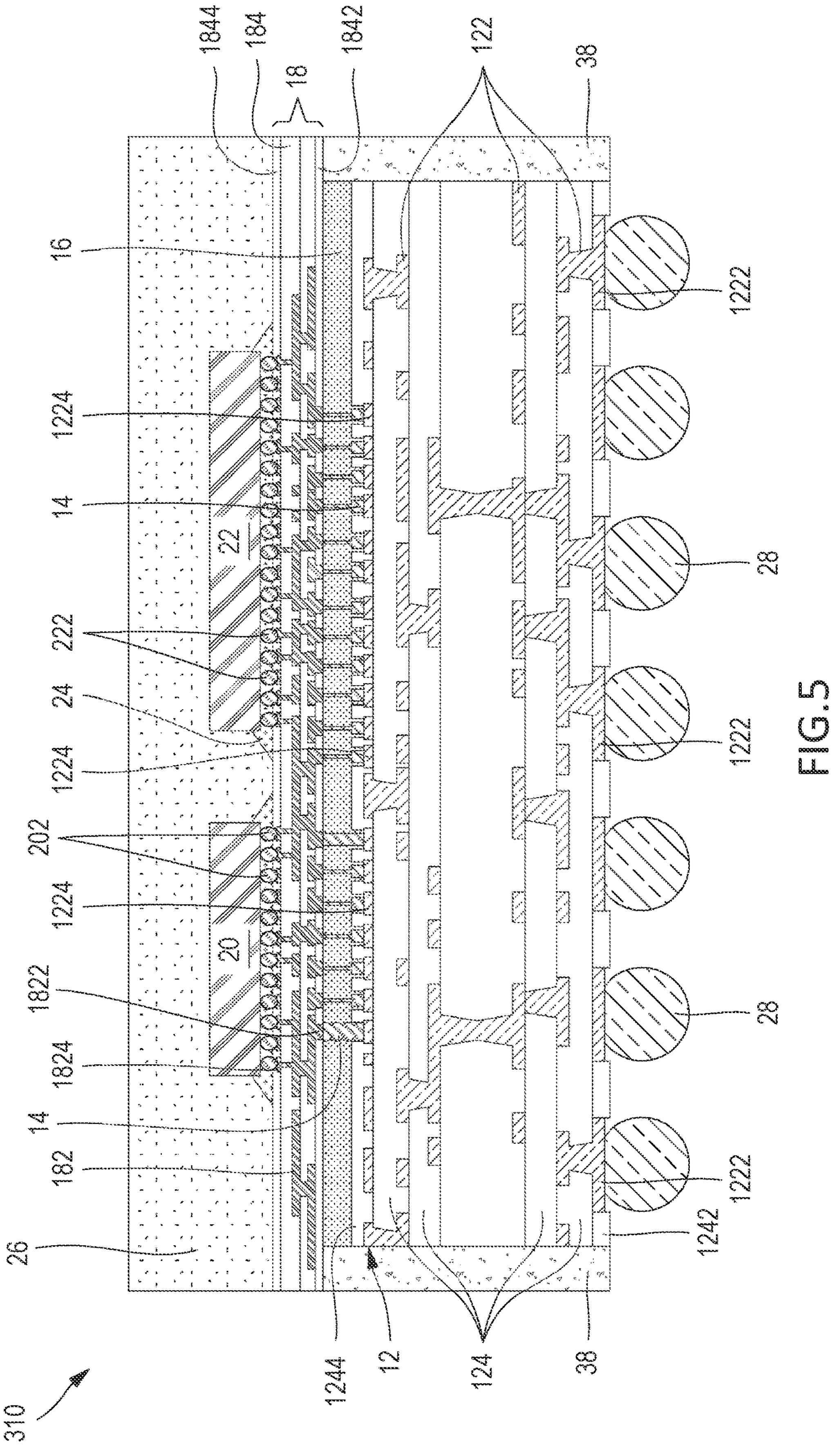
FIG. 5 shows a cross-sectional view of an example electronic device.

FIG. 5 shows a cross-sectional view of example electronic device 310. In the example shown in FIG. 5, electronic device 310 can comprise base substrate 12, vertical interconnects 14, substrate encapsulant 16, redistribution structure 18, electronic components 20 and 22, encapsulants 26 and 38, and external interconnects 28.

In this example, electronic device 310 can be similar to electronic device 10 described previously. For example, electronic device 310 can be similar to electronic device 10 in terms of base substrate 12, vertical interconnects 14, redistribution structure 18, electronic components 20 and 22, encapsulant 26, and external interconnects 28. In this example, in electronic device 310, the sidewalls of substrate encapsulant 16 can be coplanar with the sidewalls of base substrate 12, and encapsulant 38 can cover the sidewalls of base substrate 12.

FIGS. 6A to 6J show cross-sectional views of an example method for manufacturing an example electronic device, such as electronic device 310.

Figures 6A, 6B:
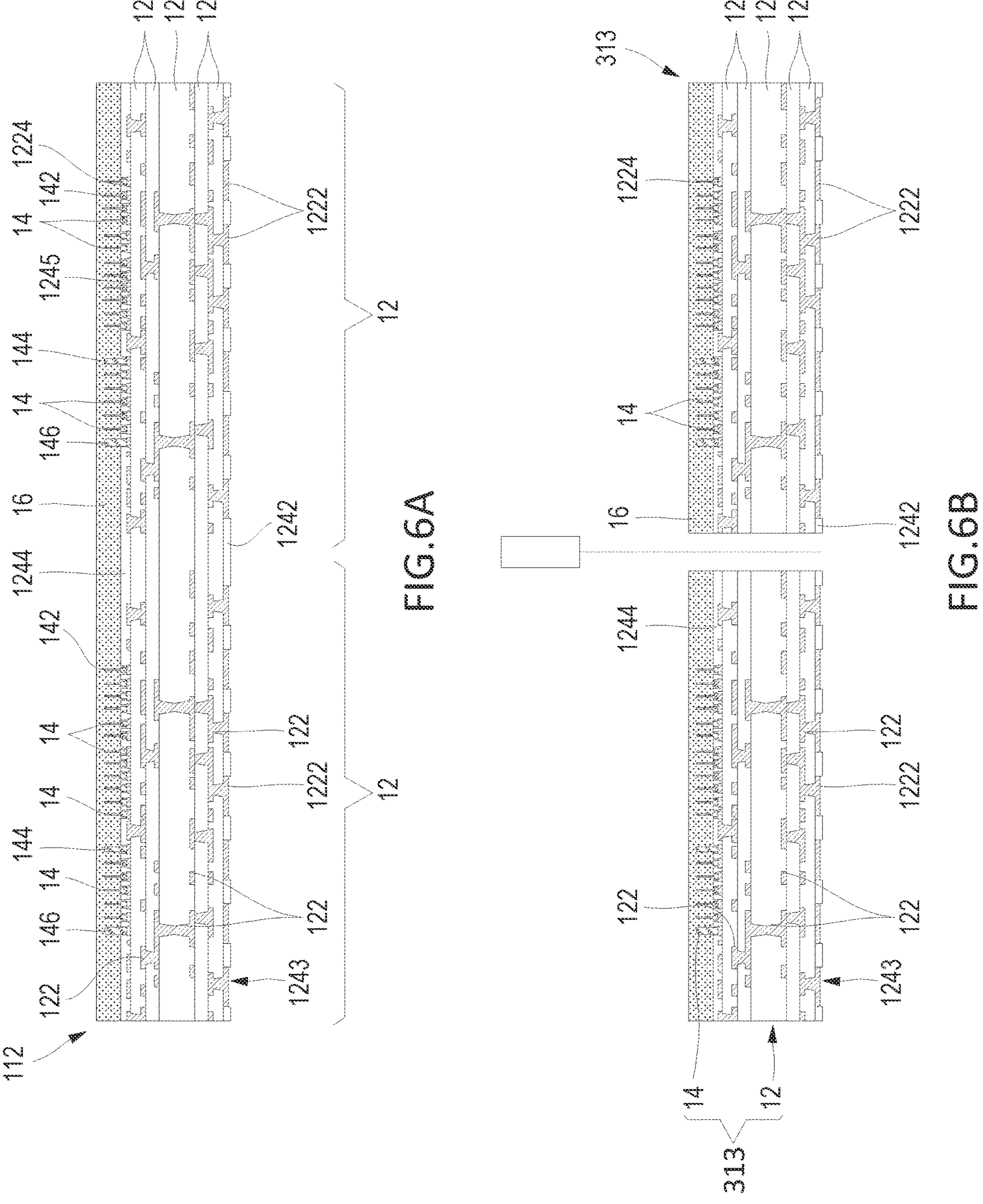
FIGS. 6A, 6B, 6C, 6D, 6E, 6F, 6G, 6H, 6I, and 6J show cross-sectional views of an example method for manufacturing an example electronic device.

FIG. 6A shows a cross-sectional view of electronic device 310 at an early stage of manufacture. In the example shown in FIG. 6A, substrate strip 112 may be provided. Substrate strip 112 may be provided as shown in FIGS. 2A and 2B. In accordance with various examples, substrate encapsulant 16 can be provided over the upper side of the substrate strip 112. Substrate encapsulant 16 can be in contact with the upper side of base substrate 12 and the upper sides and sidewalls of vertical interconnects 14. Substrate encapsulant 16 can have similar elements, features, materials, or manufacturing methods to those of substrate encapsulant 16 shown in FIG. 2E.

FIG. 6B shows a cross-sectional view of electronic device 310 at a later stage of manufacture. In the example shown in FIG. 6B, substrate strip 112 can be separated into substrate assemblies 313 through a singulation process. Each of substrate assemblies 313 can comprise base substrate 12, vertical interconnects 14, and substrate encapsulant 16. The sidewalls of substrate encapsulant 16 can be coplanar with the sidewalls of base substrate 12. In some examples, substrate strip 112 and substrate encapsulant 16 covering the upper side of substrate strip 112 can be sawed at once. Substrate assembly 313 can have an area similar to those of substrate assemblies 13 described above.

Figures 6C, 6D:
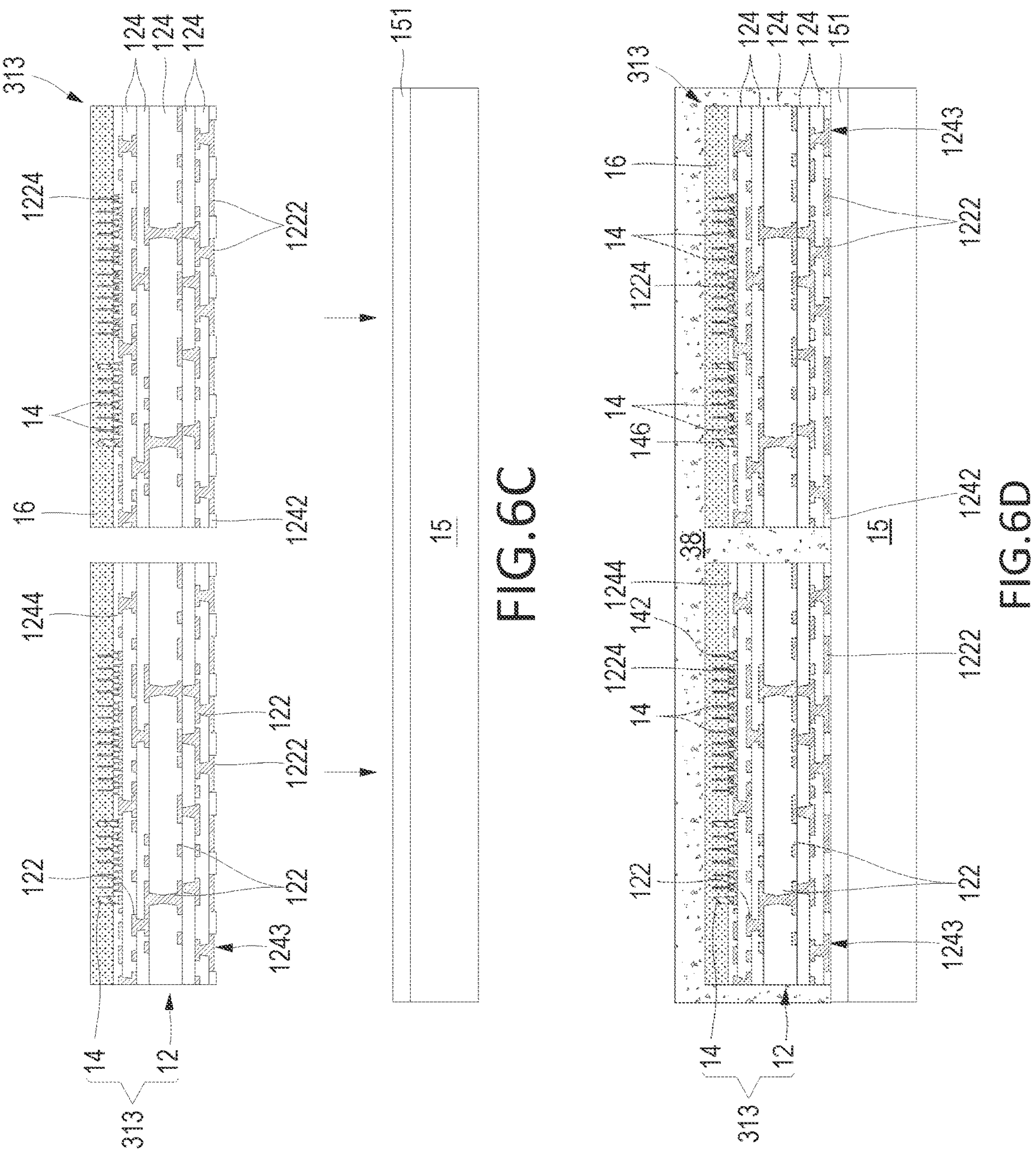

FIG. 6C shows a cross-sectional view of electronic device 310 at a later stage of manufacture. In the example shown in FIG. 6C, substrate assemblies 313 can be coupled to the upper side of carrier 15. Substrate assemblies 313 can be spaced apart from each other in rows and columns over carrier 15. Carrier 15 can comprise carrier release layer 151, as previously described.

FIG. 6D shows a cross-sectional view of electronic device 310 at a later stage of manufacture. In the example shown in FIG. 6D, encapsulant 38 can be provided to over substrate assemblies 313. Encapsulant 38 can be in contact with the upper sides and sidewalls of substrate assemblies 313 and carrier release layer 151 of carrier 15. Encapsulant 38 can be interposed between the sidewalls of adjacent substrate assemblies 313. Encapsulant 38 can be in contact with the upper sides and sidewalls of substrate encapsulant 16. Encapsulant 38 can be in contact with the sidewalls of base substrate 12. Encapsulant 38 can allow the upper sides of two or more substrate assemblies 313 to be coplanar, which can facilitate the process for providing redistribution layer 18. Encapsulant 38 can have a similar material or manufacturing method to substrate encapsulant 16 described above.

Figures 6E, 6F:
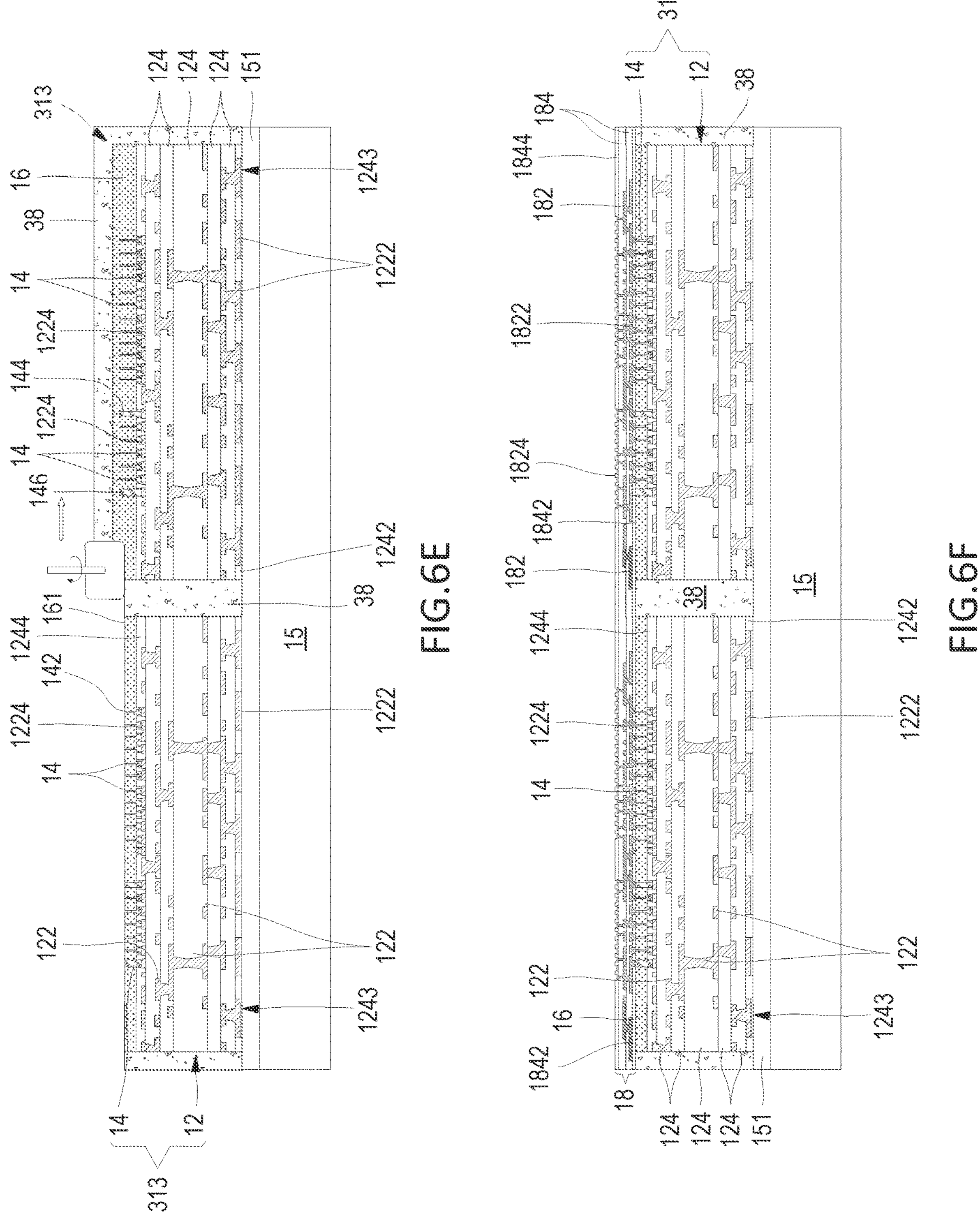

FIG. 6E shows a cross-sectional view of electronic device 310 at a later stage of manufacture. In the example shown in FIG. 6E, the upper portion of encapsulant 38 and the upper portion of substrate encapsulant 16 can be removed to expose vertical interconnects 14 through or from upper side 161 of substrate encapsulant 16. The portions of encapsulant 38 covering the upper side of the substrate encapsulant 16 can be removed such the encapsulant 38 is in contact with the sidewalls of substrate assemblies 313 and is interposed between the sidewalls of adjacent substrate assemblies 313. The upper side of encapsulant 38 can be coplanar with upper side 161 of substrate encapsulant 16 and the upper sides of vertical interconnects 14. The removal of the upper portion of substrate encapsulant 16 and the upper portion of encapsulant 38 can be similar to removal of substrate encapsulant 16 shown in FIG. 2F. In some examples, the height of substrate encapsulant 16 can be similar to height of substrate encapsulant 16 shown in FIG. 2F. In some examples, after removing the upper portion of encapsulant 38, opening, similar to openings 162 in FIG. 2F-1, may be formed in substrate encapsulant 16.

FIG. 6F shows a cross-sectional view of electronic device 310 at a later stage of manufacture. In the example shown in FIG. 6F, redistribution structure 18 can be provided to over the upper side of substrate encapsulant 16, the upper sides of vertical terminals 14, and the upper sides of encapsulant 38. Bottom dielectric 1842 of redistribution structure 18 can be in contact with the upper side of substrate encapsulant 16 and the upper side of encapsulant 38. Redistribution structure 18 can have similar elements, features, materials, or manufacturing methods to those of redistribution structure 18 shown in FIGS. 2G and 2H.

Figures 6G, 6H:
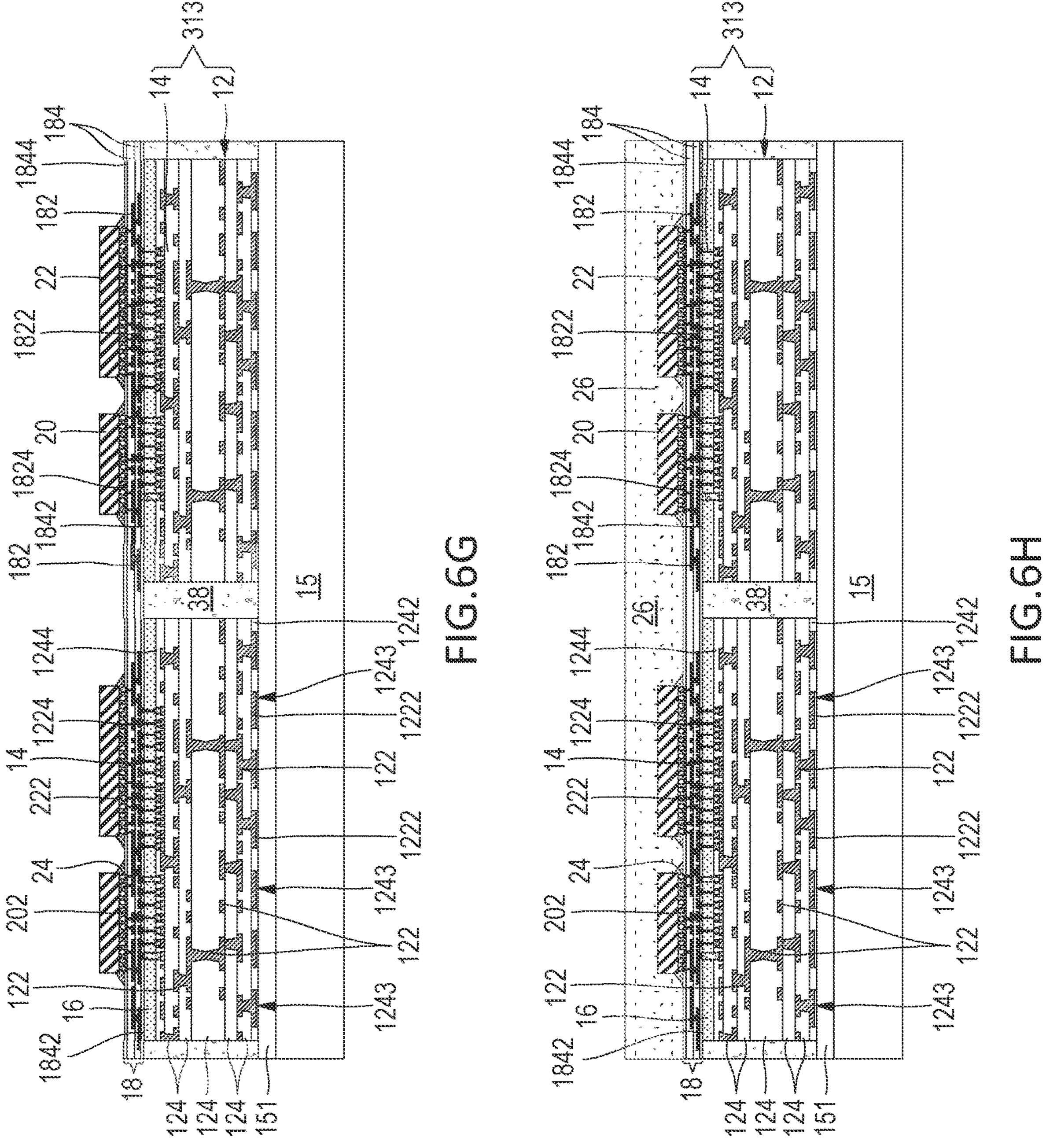

FIG. 6G shows a cross-sectional view of electronic device 310 at a later stage of manufacture. In the example shown in FIG. 6G, electronic components 20, 22 can be provided on redistribution structure 18. Electronic components 20 and 22 can have similar elements, features, materials, or manufacturing methods to those of electronic components 20 and 22 shown in FIG. 2I.

FIG. 6H shows a cross-sectional view of electronic device 310 at a later stage of manufacture. In the example shown in FIG. 6H, encapsulant 26 can be provided to over electronic components 20, 22 and redistribution structure 18. Encapsulant 26 can have similar elements, features, materials, or manufacturing methods to those of encapsulant 26 shown in FIG. 2J.

Figure 6I:
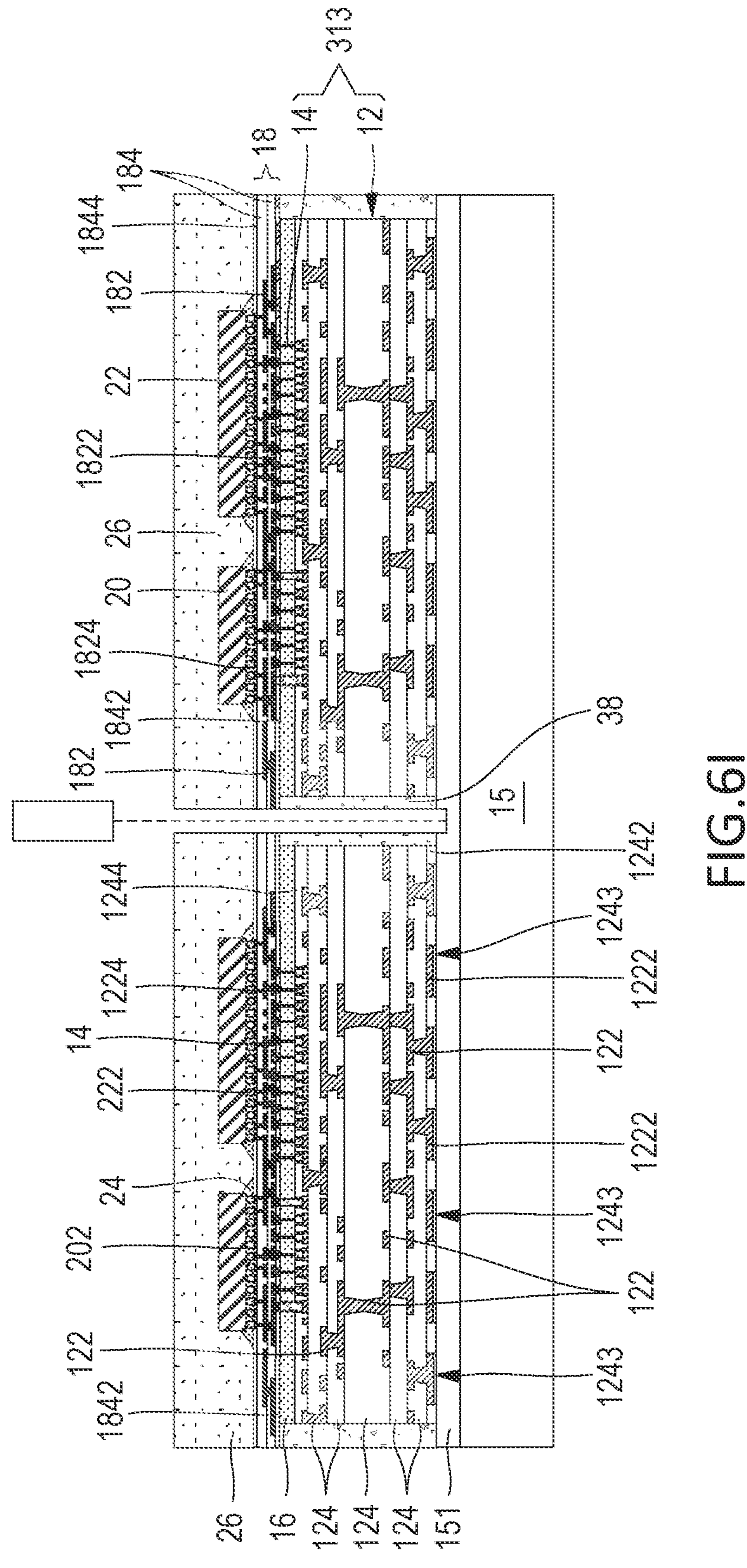

FIG. 6I shows a cross-sectional view of electronic device 310 at a later stage of manufacture. In the example shown in FIG. 6I, encapsulant 26, redistribution structure 18, and encapsulant 38 can be separated into individual electronic devices 310 through a removal process, such as a singulation process. Each of separated individual electronic devices 310 can comprise base substrate 12, vertical interconnects 14, substrate encapsulant 16, redistribution structure 18, electronic components 20 and 22, and encapsulants 26 and 38. In some examples, electronic device 310 can comprise underfill 24. In electronic device 310, redistribution structure 18 and encapsulants 26 and 38 can be exposed to, or form, the lateral sidewalls of electronic device 310. In some examples, at least a portion of encapsulant 38 remains over the sidewalls of substrate encapsulant 16 after the removal process.

Figure 6J:
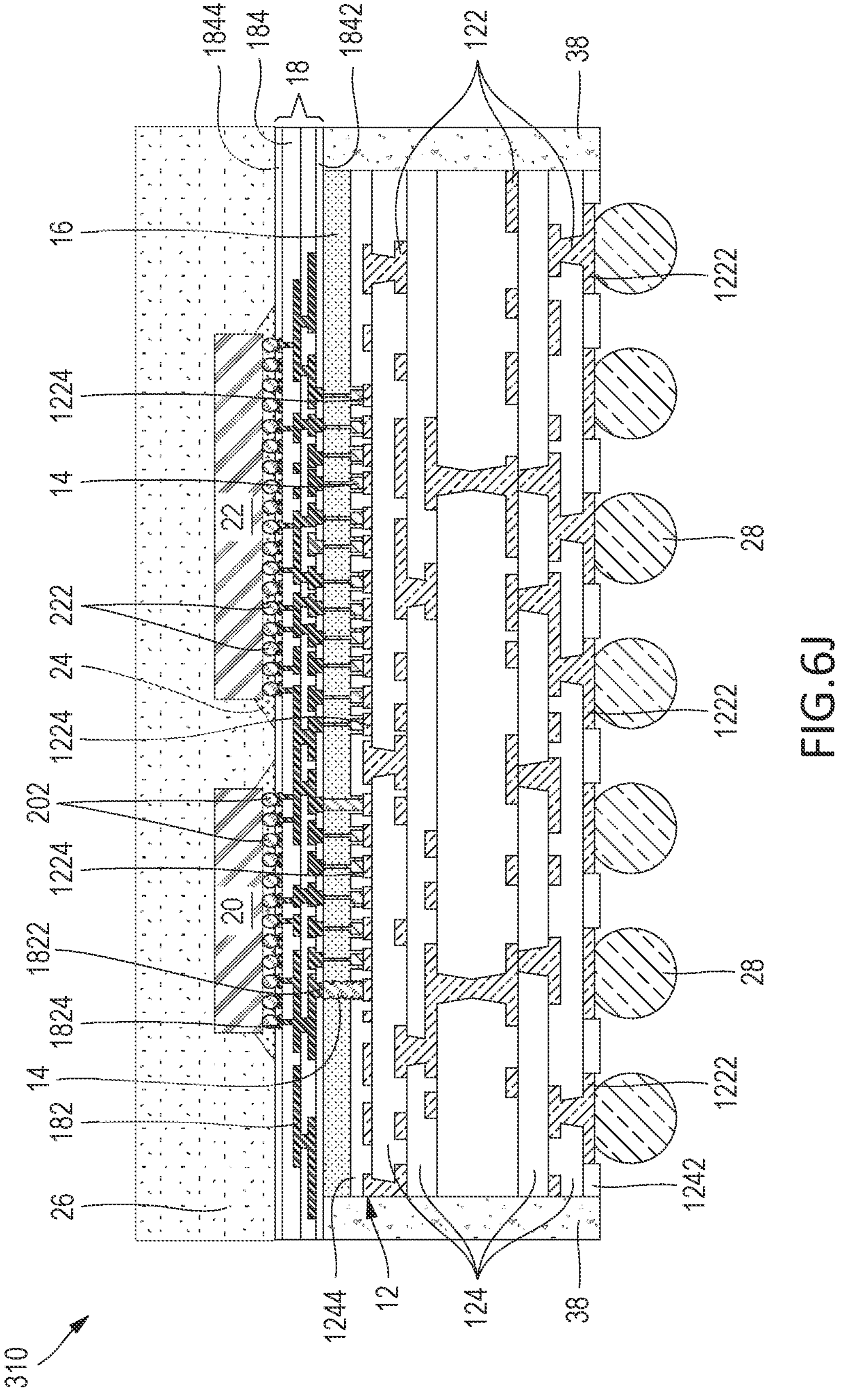

FIG. 6J shows a cross-sectional view of electronic device 310 at a later stage of manufacture. In the example shown in FIG. 6J, carrier 15 can be separated from the lower sides of electronic device 310. Removal of carrier 15 exposes the lower side of encapsulant 38, substrate bottom terminals 1222, and bottom base dielectric layer 1242 of base substrate 12. The singulation process of electronic device 310 and the separation process of carrier 15 can be similar to the singulation process of electronic device 10 and the separation process of carrier 15 shown in FIGS. 2K and 2L.

In accordance with various examples, external interconnects 28 can be provided. External interconnects 28 can be coupled to substrate bottom terminals 1222 of base substrate 12. External interconnects 28 can have similar elements, features, materials or manufacturing methods to those of external interconnects 28 shown in FIG. 2L.

Electronic device 310 can comprise base substrate 12, vertical interconnects 14, substrate encapsulant 16, redistribution structure 18, electronic components 20 and 22, encapsulants 26 and 38, and external interconnects 28.

Figure 7:
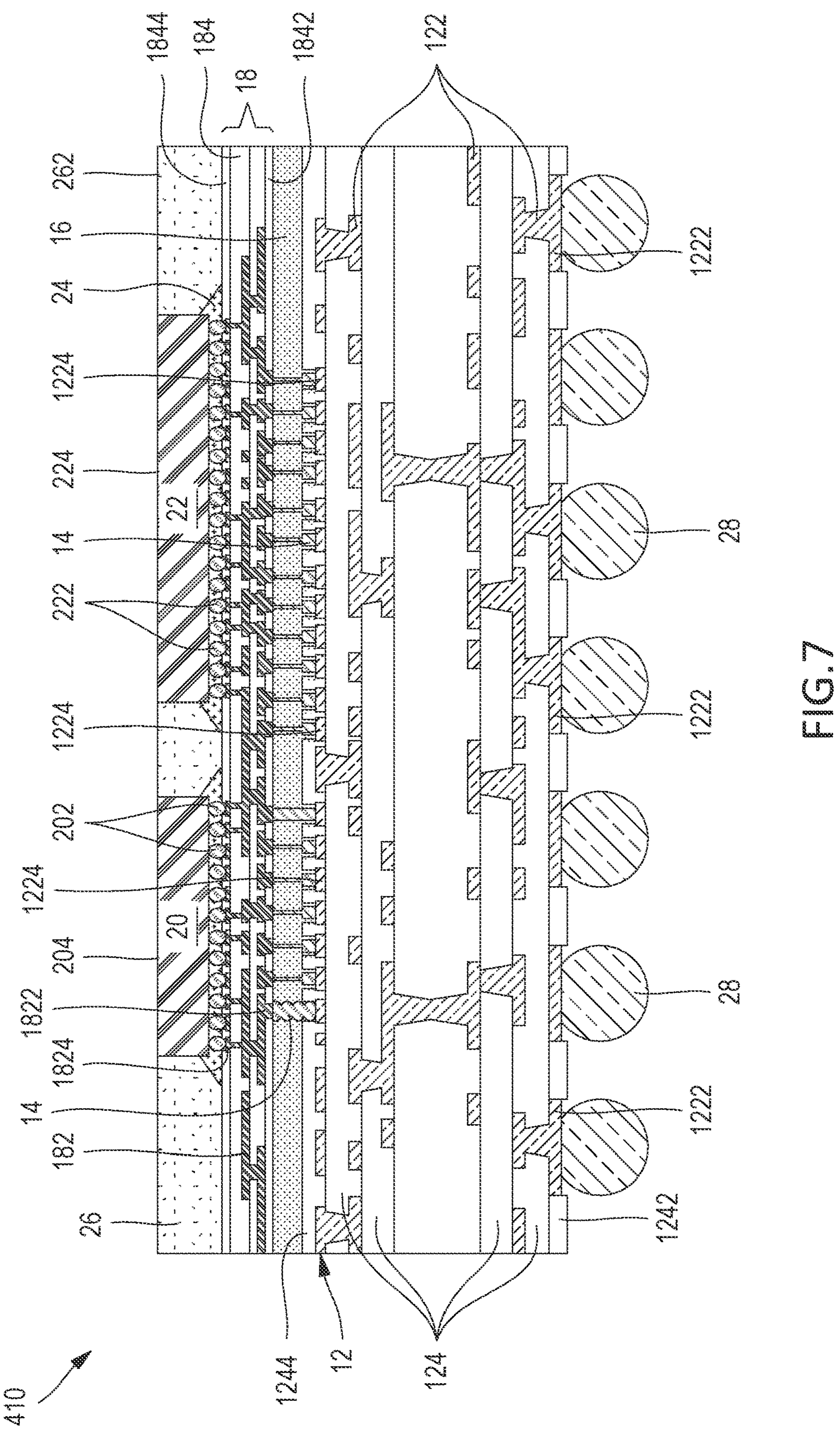
FIG. 7 shows a cross-sectional view of an example electronic device.

FIG. 7 shows a cross-sectional view of example electronic device 410. In the example shown in FIG. 7, electronic device 410 can comprise base substrate 12, vertical interconnects 14, substrate encapsulant 16, redistribution structure 18, electronic components 20 and 22, encapsulant 26, and external interconnects 28.

In this example, electronic device 410 can have a structure and a manufacturing method similar to those of electronic device 310 described above. For example, electronic device 410 can be similar to electronic device 310 in terms of the structures and manufacturing methods of base substrate 12, vertical interconnects 14, redistribution structure 18, electronic components 20 and 22, and external interconnects 28. In this example, electronic device 410 can be devoid of encapsulant 38. In this example, in electronic device 410, the sidewalls of substrate encapsulant 16 can be coplanar with the sidewalls of base substrate 12. In this example, upper side 262 of encapsulant 26 can be coplanar with upper sides 204 and 224 of electronic components 20 and 22.

In some examples, after providing encapsulant 26, as shown in FIG. 6H, the upper portion of encapsulant 26 can be removed by, for example, grinding, to expose the upper sides 204 and 224 of electronic components 20 and 22. By exposing upper sides 204 and 224 of electronic components 20 and 22, heat dissipation of the electronic components 20 and 22 can be facilitated and the height of electronic device 410 can be reduced. In some examples, encapsulant 26 can be thinned by general grinding or chemical etching.

In some examples, in the singulation process shown in FIG. 6I, encapsulant 38 covering the sidewalls of base substrate 12 and substrate encapsulant 16 can be removed. The sidewalls of substrate encapsulant 16 can be exposed to the sidewalls of electronic device 410. The sidewalls of substrate encapsulant 16 can be coplanar with the sidewalls of redistribution structure 18 and the sidewalls of encapsulant 26. In this example, electronic device 410 can be structurally similar to electronic device 210 described above.

Figure 8:
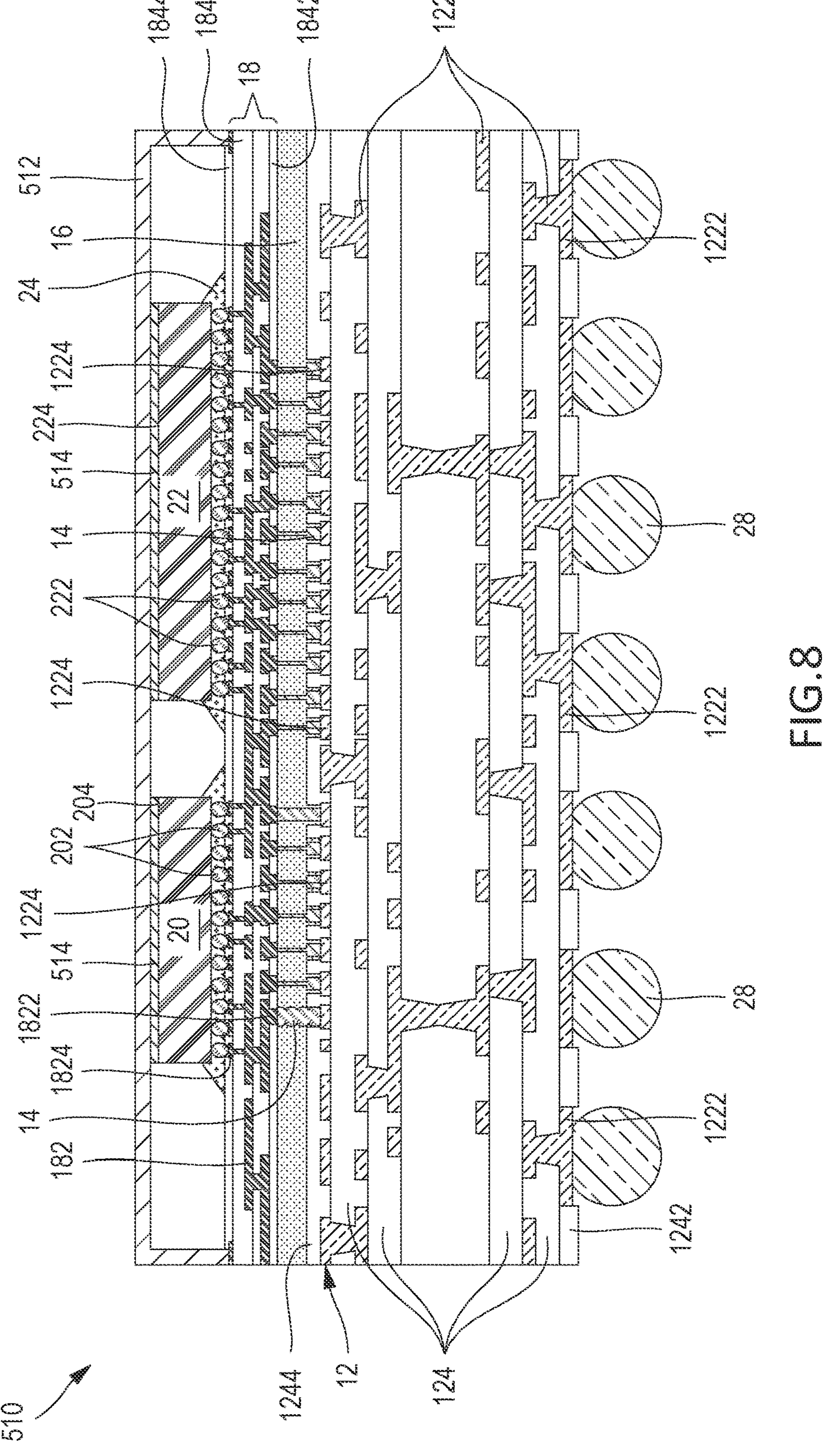
FIG. 8 shows a cross-sectional view of an example electronic device.

FIG. 8 shows a cross-sectional view of example electronic device 510. In the example shown in FIG. 8, electronic device 510 can comprise base substrate 12, vertical interconnects 14, substrate encapsulant 16, redistribution structure 18, electronic components 20 and 22, cover 512, and external interconnects 28.

In this example, electronic device 510 can have a manufacturing method and structure similar to electronic devices 210 and 410 described above. For example, electronic device 510 can be similar to electronic devices 210 and 410 in terms of the structures and manufacturing methods of base substrate 12, vertical interconnects 14, substrate encapsulant 16, redistribution structure 18, electronic components 20 and 22, and external interconnects 28. In this example, electronic device 510 does not comprise encapsulant 26. In this example, cover 512 can be coupled to the upper side of redistribution structure 18. Cover 512 can cover electronic components 20 and 22. Cover 512 can include a substantially rectangular top plate and sidewalls extending downward from the outer edges, or perimeter, of the top plate. Cover 512 can define an enclosure, or cavity, in which electronic components 20 and 22 are located. Cover 512 can cover electronic components 20 and 22.

In some examples, cover 512 can be coupled to top dielectric 1844 or top terminals 1824 of redistribution structure 18 through an adhesive. In some examples, one or more of top terminals 1824 coupled to cover 152 can be ground terminals. In some examples, cover 512 is coupled to top dielectric 1844, and the adhesive can be formed of a dielectric or other non-electrically conductive material. In some examples, cover 512 is coupled to top terminals 1824, and the adhesive can be formed of a conductive material (e.g., solder or conductive paste).

Cover 512 can be made of a metal with high heat conduction and radiation. In some examples, cover 512 can comprise aluminum or copper. In some examples, cover 512 can be referred to as or comprise a lead, a shield, a heat sink, an EMI shiel, a cap cover, a protection unit, a package, or a body. In some examples, cover 512 can protect the upper side of redistribution structure 18 and electronic components 20 and 22 from external elements and/or external exposure. In some examples, cover 512 can dissipate the heat generated by electronic components 20 and 22 and can prevent electromagnetic waves from entering. In some examples, thermal interface material (TIM) 514 can be interposed between cover 512 and electronic components 20 and 22 (e.g., between the lower side of the top plate of cover 512 and the upper sides 204, 224 of electronic components 20,22). TIM 514 can facilitate the transfer of heat generated by electronic components 20 and 22 to cover 512.

In some examples, pick-and-place equipment can pick up cover 512 in the shape of a metal cap and align and seat cover 512 on a cover adhesive provided in redistribution structure 18. Subsequently, as the cover adhesive is cured through a curing process using heat, light, or ultraviolet light, cover 512 can be adhered and fixed to redistribution structure 18. In some examples, thermal interface material 514 can be adhered and fixed between cover 512 and electronic components 20 and 22 by a curing process. The thickness of cover 512 can range from approximately 0.1 mm to approximately 1.0 mm.

Figure 9:
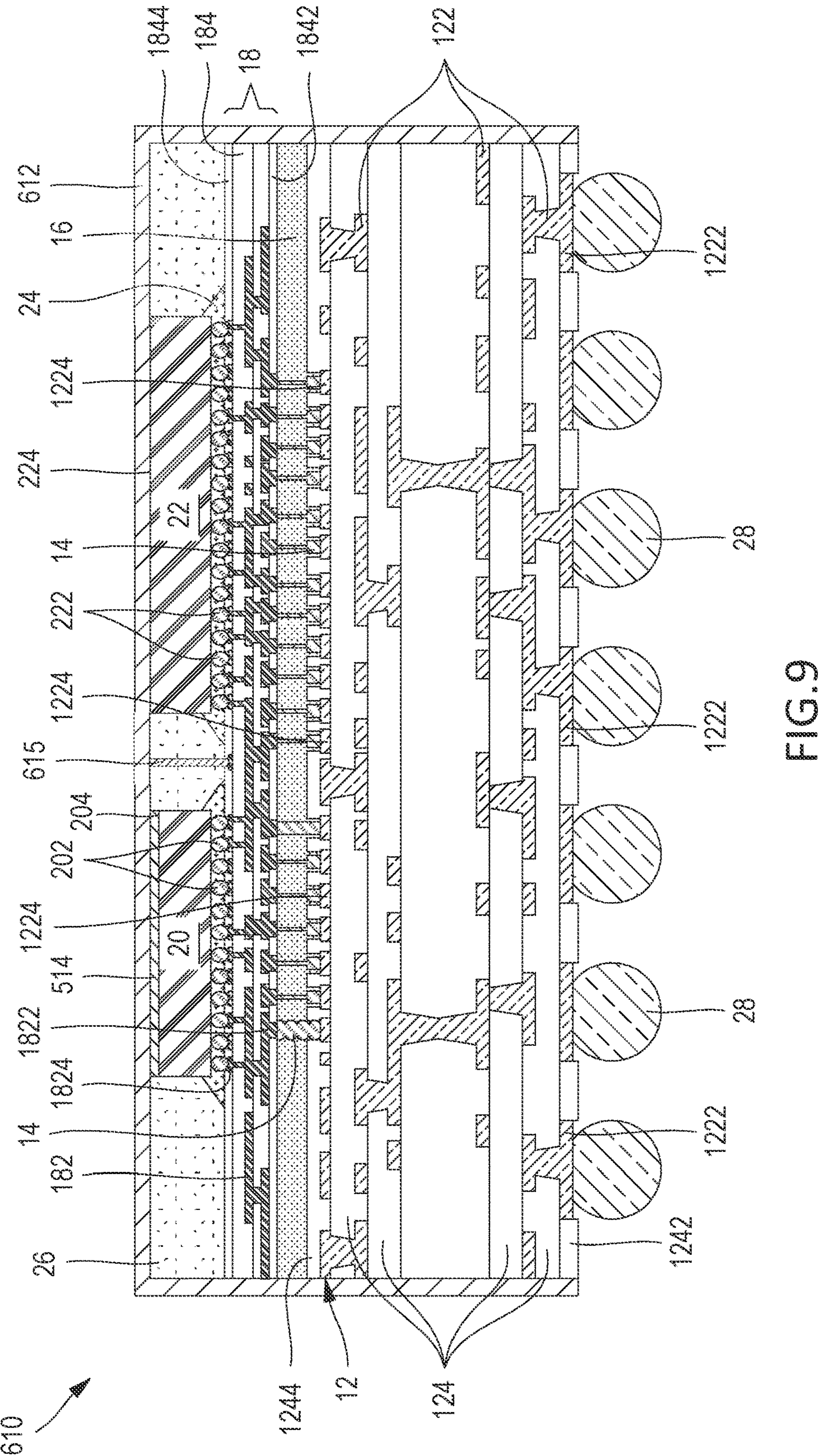
FIG. 9 shows a cross-sectional view of an example electronic device.

FIG. 9 shows a cross-sectional view of example electronic device 610. In the example shown in FIG. 9, electronic device 610 can comprise base substrate 12, vertical interconnects 14, substrate encapsulant 16, redistribution structure 18, electronic components 20 and 22, encapsulant 26, external interconnects 28, cover 612, and compartment wall 615.

In this example, electronic device 610 can have a manufacturing method and structure similar to electronic devices 210 and 410 described above. For example, electronic device 610 can be similar to electronic devices 210 and 410 in terms of the structures and manufacturing methods of base substrate 12, vertical interconnects 14, substrate encapsulant 16, redistribution structure 18, electronic components 20 and 22, encapsulant 26, and external interconnects 28. In this example, in electronic device 610, cover 612 can be provided to cover the upper side and sidewalls of electronic device 610.

Cover 612 can be in contact with the upper side and sidewalls of encapsulant 26, the sidewalls of redistribution structure 18, the sidewalls of substrate encapsulant 16, and the sidewalls of base substrate 12. In some examples, cover 612 can be in contact with upper side 224 of electronic component 22. In some examples, TIM 514 can be interposed between electronic component 20 and cover 612. TIM 514 can be in contact with the upper side 204 of electronic component 20 and the lower side of cover 612. In some examples, TIM 514 can also be located between with the upper side 224 of electronic component 22 and the lower side of cover 612 or upper side 204 of electronic component 20 can contact the lower side of cover 612.

In some examples, cover 612 can comprise or be referred to as a lid, a shield, a heat sink, an EMI shield, a conformal shield, a conformal coating, a cap cover, a protection unit, a package, or a body. In some examples, cover 612 can comprise nickel (Ni), palladium (Pd), copper (Cu), Steel Use Stainless (SUS), gold (Au) or aluminum (Al). In some examples, cover 612 can be formed by sputtering, printing, coating, spraying, or plating. In some examples, the thickness of cover 612 can range from approximately 1 μm to approximately 10 μm or approximately 3 μm to approximately 5 μm.

In some examples, electronic device 610 includes compartment wall 615. Compartment wall 615 can extend through encapsulant 26 and couple cover 612 to top terminals 1824 of redistribution structure 18. In some examples, compartment wall 615 can penetrate between the upper side and the lower side of encapsulant 26 and is interposed between electronic component 20 and electronic component 22. One or more of the top terminals 1824 coupled to compartment wall 615 can be ground terminals. Compartment wall 615 can have corresponding elements, features, materials, or manufacturing methods similar to those of vertical interconnects 14. In some examples, compartment wall 615 can comprise or be referred to as a vertical wire fence. In some examples, compartment wall 615 can be provided by forming a trench exposing top terminals 1824 downwardly from the upper side of encapsulant 26, and then filling the interior of the trench with solder. Compartment wall 615 can shield electromagnetic waves between electronic component 20 and electronic component 22.

In summary, electronic devices and methods of manufacturing electronic devices have been described for, among other things, packaged electronic devices having fine-pitch interconnections. In some examples, vertical interconnects are coupled to a base substrate and covered by a substrate encapsulant. Distal ends of the vertical interconnects are exposed from the substrate encapsulant, and a redistribution structure is provided over the substrate encapsulant. The redistribution structure includes a conductive structure that interfaces bottom terminals coupled to the vertical interconnects to top terminals. Electronic components are coupled to the top terminals. In some examples, the electronic components are covered with an encapsulant. In some examples, portions of the electronic components are exposed from the encapsulant. In some examples, a lid or cover is over the electronic components, which can be coupled to the redistribution structure or the base substrate. In some examples, the lid is provided over the encapsulant. In some examples, the lid is used without the encapsulant. In some examples, the lid is electrically coupled to one or more of the redistribution structure or the base substrate. In some examples, the lid is coupled to the electronic components with a TIM structure.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:

1. An electronic device, comprising:

a base substrate comprising:
  - a base substrate top side;
  - a base substrate bottom side opposite to the base substrate top side;
  - base substrate sidewalls;
  - a base dielectric structure; and
  - a base conductive structure comprising substrate top terminals adjacent to the base substrate top side;
  - wherein:
    - the base dielectric structure comprises a top base dielectric that defines the base substrate top side and comprises openings that expose the substrate top terminals;
    - the substrate top terminals are recessed below the base substrate top side; and
    - the substrate top terminals comprise a first width;

vertical interconnects comprising proximate ends coupled to the substrate top terminals within the openings and distal ends opposite to the proximate ends, wherein the proximate ends each comprise a first diameter that is less than the first width;

a substrate encapsulant covering portions of the base substrate top side and the vertical interconnects and comprising a substrate encapsulant top side, wherein the distal ends of the vertical interconnects are exposed from the substrate encapsulant top side;

a redistribution structure over the substrate encapsulant and comprising:
  - a redistribution structure top side;
  - a redistribution structure bottom side opposite to the redistribution structure top side;
  - a redistribution dielectric structure comprising a first dielectric over the substrate encapsulant top side and comprising first openings exposing the distal ends of the vertical interconnects; and
  - a redistribution conductive structure positioned within the redistribution dielectric structure and comprising:
    - redistribution bottom terminals adjacent to the redistribution structure bottom side and coupled to the vertical interconnects through the first openings; and
    - redistribution top terminals adjacent to the redistribution structure top side; and a first electronic component coupled to the redistribution top terminals at the redistribution structure top side.

2. The electronic device of claim 1, further comprising:

an encapsulant covering at least portions of the first electronic component and portions of the redistribution structure;

wherein:
  - the substrate top terminals comprise upper sides; and
  - the top base dielectric overlaps onto the upper sides of the substrate top terminals.

3. The electronic device of claim 2, wherein:

the first electronic component comprises a first side proximate to the redistribution structure and a second side opposite to the first side; and the second side is exposed from the encapsulant.

4. The electronic device of claim 3, further comprising:

a thermal interface material (TIM) over the second side of the first electronic component; and a cover over the encapsulant and coupled to the TIM.

5. The electronic device of claim 1, wherein:

the vertical interconnects comprise wire bonded conductive wires comprising:
  - interconnect heads coupled to the substrate top terminals and each comprising the first diameter; and
  - interconnect tails coupled to the interconnect heads and each comprising a second diameter less than the first diameter, wherein the wire bonded conductive wires comprise an overall height.

6. The electronic device of claim 5, wherein:

the interconnect heads are connected to the substrate top terminals within the openings of the top base dielectric at a location below the base substrate top side;

the first diameter is between 20 microns and 40 microns;

the second diameter is between 13 microns and 30 microns;

the overall height is between 200 microns and 500 microns;

the substrate top terminals comprise a first pitch between adjacent substrate top terminals;

the redistribution top terminals comprise a second pitch between adjacent redistribution top terminals; and the second pitch is less than the first pitch.

7. The electronic device of claim 1, wherein:

the substrate encapsulant covers the base substrate sidewalls.

8. The electronic device of claim 1, wherein:

the distal ends of the vertical interconnects are substantially coplanar with the substrate encapsulant top side.

9. The electronic device of claim 1, wherein:

the distal ends of the vertical interconnects are recessed below the substrate encapsulant top side; and the redistribution bottom terminals contact the distal ends of the vertical interconnects below the substrate encapsulant top side.

10. The electronic device of claim 1, further comprising:

an encapsulant covering the base substrate sidewalls without extending to overlap the base substrate top side;

wherein:

the substrate encapsulant covers the base substrate top side and comprises substrate encapsulant sidewalls that are coplanar with the base substrate sidewalls; and the encapsulant covers the substrate encapsulant sidewalls.

11. An electronic device, comprising:

a base substrate comprising:

a base substrate upper side;

a base substrate lower side opposite to the base substrate upper side;

base substrate sidewalls; and a base conductive structure comprising substrate upper terminals adjacent to the base substrate upper side, wherein the substrate upper terminals comprise a first width;

vertical interconnects comprising first ends coupled to the substrate upper terminals and second ends opposite to the first ends, wherein the first ends comprise a first diameter less than the first width;

a substrate encapsulant covering portions of the base substrate upper side and the vertical interconnects, wherein:

the substrate encapsulant comprises a substrate encapsulant upper side; and the second ends of the vertical interconnects are exposed from the substrate encapsulant upper side;

a redistribution structure over the substrate encapsulant and comprising:

a redistribution structure upper side;

a redistribution structure lower side opposite to the redistribution structure upper side;

a redistribution dielectric structure; and a redistribution conductive structure comprising redistribution upper terminals adjacent to the redistribution structure upper side, and redistribution lower terminals adjacent to the redistribution structure lower side and coupled to the vertical interconnects and the redistribution upper terminals;

a first electronic component coupled to the redistribution upper terminals adjacent to the redistribution structure upper side; and an encapsulant covering the base substrate sidewalls without extending to overlap the base substrate upper side;

wherein:

the vertical interconnects comprise wire bonded conductive wires comprising:

interconnect heads coupled to the substrate upper terminals and each comprising the first diameter, which is a maximum diameter for each of the vertical interconnects; and interconnect tails coupled to the interconnect heads and each comprising a second diameter less than the first diameter, wherein the wire bonded conductive wires comprise an overall height;

the substrate encapsulant covers the base substrate upper side and comprises substrate encapsulant sidewalls that are coplanar with the base substrate sidewalls;

the encapsulant covers the substrate encapsulant sidewalls;

the redistribution dielectric structure comprises a bottom dielectric adjacent to the substrate encapsulant upper side;

the bottom dielectric comprises bottom dielectric openings exposing the vertical interconnects; and the redistribution lower terminals connect to the vertical interconnects through the bottom dielectric openings.

12. The electronic device of claim 11, wherein:

the wire bonded conductive wires are characterized by an overall height to second diameter ratio between 6 to 1 and 33 to 1;

the interconnect heads comprise a first pitch between adjacent interconnect heads;

the redistribution upper terminals comprise a second pitch between adjacent redistribution upper terminals that is less than the first pitch; and the first pitch is less than 90 microns.

13. The electronic device of claim 11, further comprising:

a cover over the first electronic component and the redistribution structure.

14. The electronic device of claim 13, wherein:

the cover is electrically coupled to one or more of the redistribution conductive structure or the base conductive structure.

15. The electronic device of claim 13, further comprising:

a second encapsulant between the cover and the redistribution structure.

16. A method of manufacturing an electronic device, comprising:

providing a substrate assembly comprising:

a base substrate comprising:

a base substrate top side;

a base substrate bottom side opposite to the base substrate top side;

base substrate sidewalls;

a base dielectric structure; and a base conductive structure comprising substrate top terminals adjacent to the base substrate top side, wherein the base dielectric structure comprises a top base dielectric that defines the base substrate top side and comprises openings that expose the substrate top terminals, and wherein the substrate top terminals are recessed below the base substrate top side, and wherein the substrate top terminals comprise a first width;

vertical interconnects comprising first ends coupled to the substrate top terminals within the openings and second ends opposite to the first ends, wherein the first ends comprise a first diameter less than the first width;

a substrate encapsulant covering portions of the base substrate top side and the vertical interconnects, wherein:

the substrate encapsulant comprises a substrate encapsulant top side; and the second ends of the vertical interconnects are exposed from the substrate encapsulant top side; and a redistribution structure over the substrate encapsulant and comprising:

a redistribution structure top side;

a redistribution structure bottom side opposite to the redistribution structure top side;

a redistribution dielectric structure comprising a first dielectric over the substrate encapsulant top side and comprising first openings exposing the second ends of the vertical interconnects; and a redistribution conductive structure positioned within the redistribution dielectric structure and comprising:

redistribution bottom terminals adjacent to the redistribution structure bottom side and coupled to the vertical interconnects through the first openings; and redistribution top terminals adjacent to the redistribution structure top side; and coupling a first electronic component to the redistribution top terminals at the redistribution structure top side.

17. The method of claim 16, wherein:

providing the substrate assembly comprises:

providing the base substrate as one of a plurality of base substrates comprising base substrate top sides and the substrate top terminals;

wire bonding conductive wires to the substrate top terminals to provide the vertical interconnects, wherein the conductive wires comprise interconnect heads coupled to the substrate top terminals and each comprising the first diameter and interconnect tails coupled to the interconnect heads and each comprising a second diameter less than the first diameter;

forming the substrate encapsulant over the base substrate top sides and the conductive wires;

removing a portion of the substrate encapsulant to provide the substrate encapsulant top side and to expose the interconnect tails from the substrate encapsulant top side; and forming the redistribution structure over the substrate encapsulant;

coupling the first electronic component comprises:

providing the first electronic component as one of a plurality of electronic components; and coupling the plurality of electronic components including the first electronic component to the redistribution top terminals; and the method further comprises singulating the substrate assembly through the redistribution structure and the substrate encapsulant.

18. The method of claim 16, wherein:

providing the substrate assembly comprises:

providing the base substrate as one of a plurality of base substrates, each of the plurality of base substrates comprising base substrate top sides, the substrate top terminals, and the base substrate sidewalls;

coupling the plurality of base substrates to a carrier, wherein the plurality of base substrates are laterally spaced apart on the carrier;

wire bonding conductive wires to the substrate top terminals to provide the vertical interconnects, wherein the conductive wires comprise interconnect heads coupled to the substrate top terminals and each comprising the first diameter and interconnect tails coupled to the interconnect heads and each comprising a second diameter less than the first diameter;

forming the substrate encapsulant over the base substrate top sides, the vertical interconnects, and the base substrate sidewalls;

removing a portion of the substrate encapsulant to provide the substrate encapsulant top side and to expose the interconnect tails from the substrate encapsulant top side; and forming the redistribution structure over the substrate encapsulant;

coupling the first electronic component comprises:

providing the first electronic component as one of a plurality of electronic components; and coupling the plurality of electronic components including the first electronic component to the redistribution top terminals; and the method further comprises singulating the substrate assembly through the redistribution structure and the substrate encapsulant.

19. The method of claim 16, wherein:

providing the substrate assembly comprises:

providing the base substrate as one of a plurality of base substrates comprising base substrate top sides and the substrate top terminals;

wire bonding conductive wires to the substrate top terminals to provide the vertical interconnects, wherein the conductive wires comprise interconnect heads coupled to the substrate top terminals and each comprising the first diameter and interconnect tails coupled to the interconnect heads and each comprising a second diameter less than the first diameter;

forming the substrate encapsulant over the base substrate top sides and the vertical interconnects;

singulating the substrate encapsulant and the plurality of base substrates to provide the substrate encapsulant with substrate encapsulant sidewalls and each base substrate with the base substrate sidewalls;

providing an encapsulant over the substrate encapsulant including the substrate encapsulant sidewalls and the base substrate sidewalls;

removing the encapsulant above the substrate encapsulant and a portion of the substrate encapsulant to provide the substrate encapsulant top side and to expose the interconnect tails from the substrate encapsulant top side, wherein at least a portion of the encapsulant remains over the substrate encapsulant sidewalls; and forming the redistribution structure over the substrate encapsulant;

coupling the first electronic component comprises:

providing the first electronic component as one of a plurality of electronic components; and coupling the plurality of electronic components including the first electronic component to the redistribution top terminals; and the method further comprises singulating the substrate assembly through the redistribution structure and the encapsulant.

* * * * *